(12) United States Patent
Katakami et al.

(10) Patent No.: US 8,421,155 B2
(45) Date of Patent: Apr. 16, 2013

(54) SEMICONDUCTOR DEVICE AND METHOD OF MANUFACTURING SEMICONDUCTOR DEVICE

(75) Inventors: Akira Katakami, Yokohama (JP); Eiji Yoshida, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/310,298

(22) Filed: Dec. 2, 2011

(65) Prior Publication Data

US 2012/0193717 A1 Aug. 2, 2012

(30) Foreign Application Priority Data

Feb. 2, 2011 (JP) ................................. 2011-020834

(51) Int. Cl.
*H01L 27/12* (2006.01)
*H01L 21/335* (2006.01)

(52) U.S. Cl.
USPC ............ 257/348; 257/E29.273; 257/E21.411; 257/E21.546; 438/142

(58) Field of Classification Search .................. 257/348, 257/237, 369, E29.273, E21.411, E21, 546; 438/142, 151, 300
See application file for complete search history.

(56) References Cited

U.S. PATENT DOCUMENTS

2006/0043494 A1* 3/2006 Ipposhi et al. ................ 257/369

FOREIGN PATENT DOCUMENTS

| JP | 2001-032051 A | 2/2001 |
| JP | 2004-311724 A | 11/2004 |

* cited by examiner

*Primary Examiner* — Tom Thomas
*Assistant Examiner* — Nikolay Yushin
(74) *Attorney, Agent, or Firm* — Fujitsu Patent Center

(57) ABSTRACT

A semiconductor device includes a first device isolation insulating film formed in a semiconductor substrate, a first well having a first conductivity type, defined by the first device isolation insulating film, and shallower than the first device isolation insulating film, a second device isolation insulating film formed in the first well, shallower than the first well, and defining a first part of the first well and a second part of the first well, a gate insulating film formed above the first part, a gate electrode formed above the gate insulating film, and an interconnection electrically connected to the second part of the first well and the gate electrode, wherein an electric resistance of the first well in a first region below the second device isolation insulating film is lower than an electric resistance of the first well in a second region other than the first region on the same depth level.

16 Claims, 54 Drawing Sheets

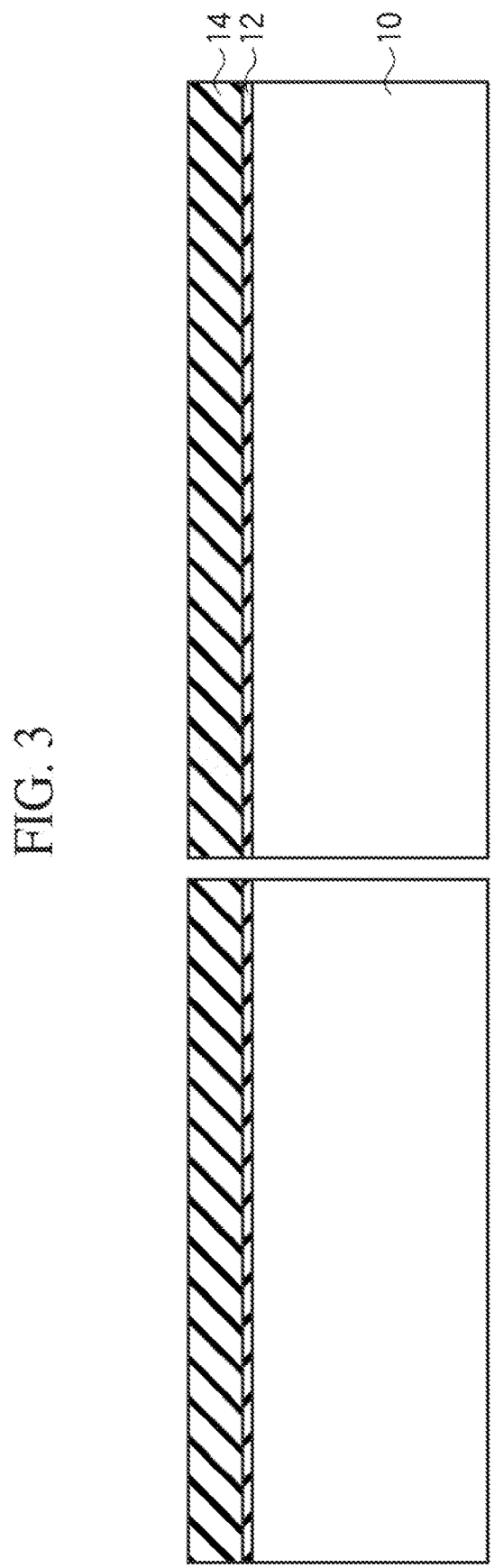

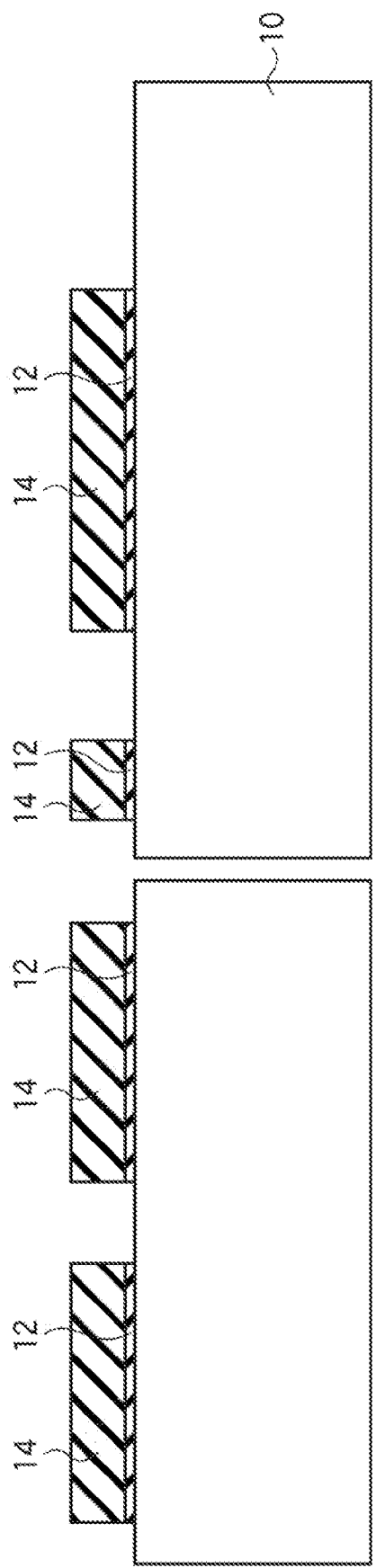

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2011-020834, filed on Feb. 2, 2011, the entire contents of which are incorporated herein by reference.

FIELD

The embodiments discussed herein are related to a semiconductor device and method of manufacturing a semiconductor device.

BACKGROUND

As a transistor structure for decreasing the power consumption of semiconductor devices is proposed a structure called DTMOS (Dynamic Threshold Voltage MOSFET). The DTMOS is a transistor structure having the body electrodes of the respective transistors isolated from each other by the use of the STI and having the gate electrode and the body electrode short-circuited. In the DTMOS, when a transistor is ON, a large drive current can be obtained because the threshold voltage becomes relatively lower in comparison with the threshold voltage in the OFF state by the forward bias to the body electrode, and on the other hand, when the transistor is OFF, the leakage current can be maintained because of zero bias to the body electrode.

As a transistor structure for decreasing the body resistance of the DTMOS is proposed a structure called B-DTMOS (Bulk Dynamic Threshold Voltage MOSFET). The B-DTMOS is a transistor structure having the body electrodes of the respective transistors isolated from each other by the use of double wells formed in bulk substrate and trench device isolation. The B-DTMOS can easily control the thickness of the body region, and can much decrease the body resistance.

In the structure having the wells of the respective transistors isolated by the trench device isolation described above, the lead-out of the body electrode is a problem. As one of the countermeasures to this problem, a structure having the transistor portion and the body electrode leading-out portion isolated by shallow trench is proposed. In this structure, however, the body region below the shallow trench is reduced and has the resistance increased. The increase of the body resistance leads to the decrease of the operation speed and the increase of the power consumption.

The followings are examples of related: Japanese Laid-open Patent Publication No. 2004-311724; and Japanese Laid-open Patent Publication No. 2001-032051.

For higher speed and lower power consumption of the transistor, a semiconductor device of a structure which can decrease the body resistance, and its manufacturing method are expected.

SUMMARY

According to one aspect of an embodiment, there is provided a semiconductor device including a first device isolation insulating film formed in a semiconductor substrate, a first well having a first conductivity type, defined by the first device isolation insulating film, and shallower than the first device isolation insulating film, a second device isolation insulating film formed in the first well, shallower than the first well, and defining a first part of the first well and a second part of the first well, a gate insulating film formed above the first part, a gate electrode formed above the gate insulating film, and an interconnection electrically connected to the second part of the first well and the gate electrode, wherein an electric resistance of the first well in a first region below the second device isolation insulating film is lower than an electric resistance of the first well in a second region other than the first region on the same depth level.

According to another aspect of an embodiment, there is provided a method of manufacturing a semiconductor device including forming in a semiconductor substrate a first device isolation trench and a second device isolation trench shallower than the first device isolation trench, the first device isolation trench defining a first region, the second device isolation trench defining a first part and a second part in the first region, forming an impurity layer of a first conductivity type in a bottom of the second device isolation trench, forming a first insulating film above the semiconductor substrate with the first device isolation trench and the second device isolation trench formed in, planarizing the first insulating film to form a first device isolation insulating film buried in the first device isolation trench and a second device isolation insulating film buried in the second device isolation trench, forming in the first region of the semiconductor substrate a first well of the first conductivity type, deeper than a bottom of the second device isolation insulating film, and shallower than a bottom of the first device isolation insulating film, forming a gate insulating film above the first part, forming a gate electrode above the gate insulating film, and forming an interconnection electrically connected to the second part of the first well and the gate electrode.

According to further another aspect of an embodiment, there is provided a method of manufacturing a semiconductor device including forming in a semiconductor substrate a first device isolation trench and a second device isolation trench shallower than the first device isolation trench, the first device isolation trench defining a first region, the second device isolation trench defining a first part and a second part in the first region, forming a metal silicide layer selectively on a bottom of the second device isolation trench, forming a first insulating film above the semiconductor substrate with the first device isolation trench and the second device isolation trench formed in, planarizing the first insulating film to form a first device isolation insulating film buried in the first device isolation trench and a second device isolation insulating film buried in the second device isolation trench, forming in the first region of the semiconductor substrate a first well of the first conductivity type, deeper than a bottom of the second device isolation insulating film, and shallower than a bottom of the first device isolation insulating film, forming a gate insulating film above the first part, forming a gate electrode above the gate insulating film, and forming an interconnection electrically connected to the second part of the first well and the gate electrode.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3 to 20 are sectional views illustrating a method of manufacturing the semiconductor device according to the first embodiment;

DESCRIPTION OF EMBODIMENTS

A First Embodiment

A semiconductor device and a method of manufacturing the same according to a first embodiment will be described with reference to FIGS. 1 to 20.

Figure 1:
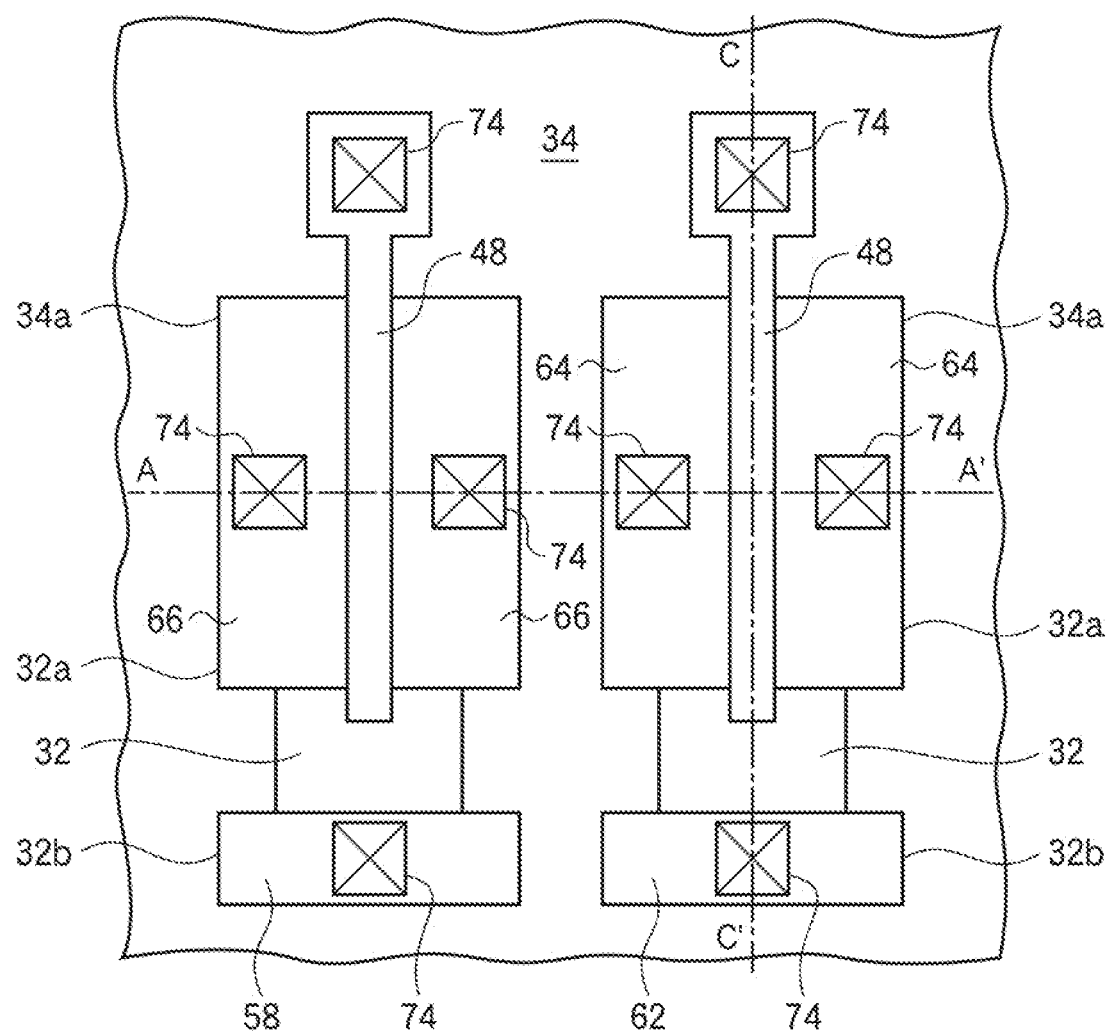
FIG. 1 is a plan view illustrating a structure of a semiconductor device according to a first embodiment.
Figure 2A:
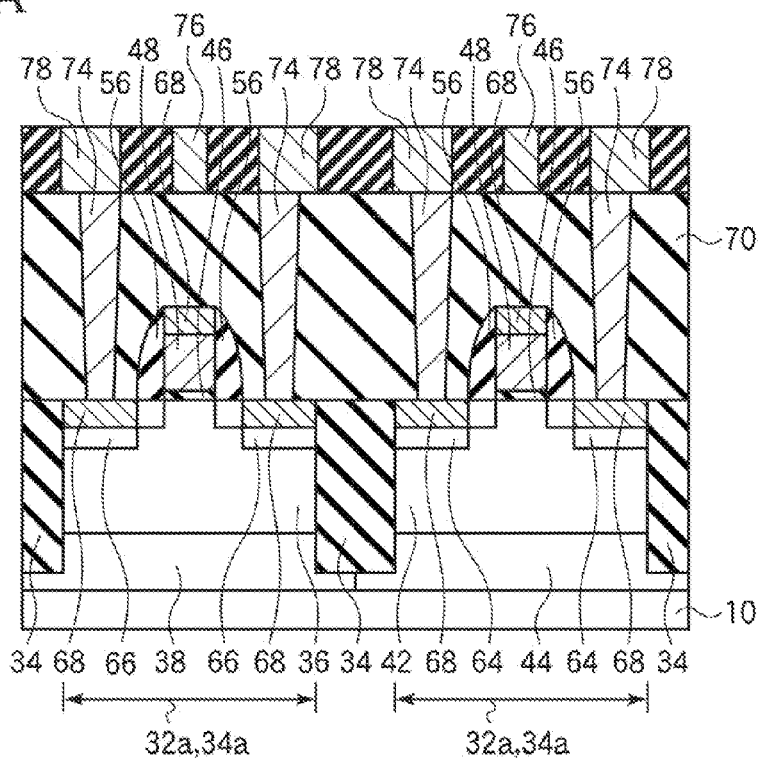
FIGS. 2A and 2B are diagrammatic sectional views illustrating the structure of the semiconductor device according to the first embodiment.
Figure 2B:
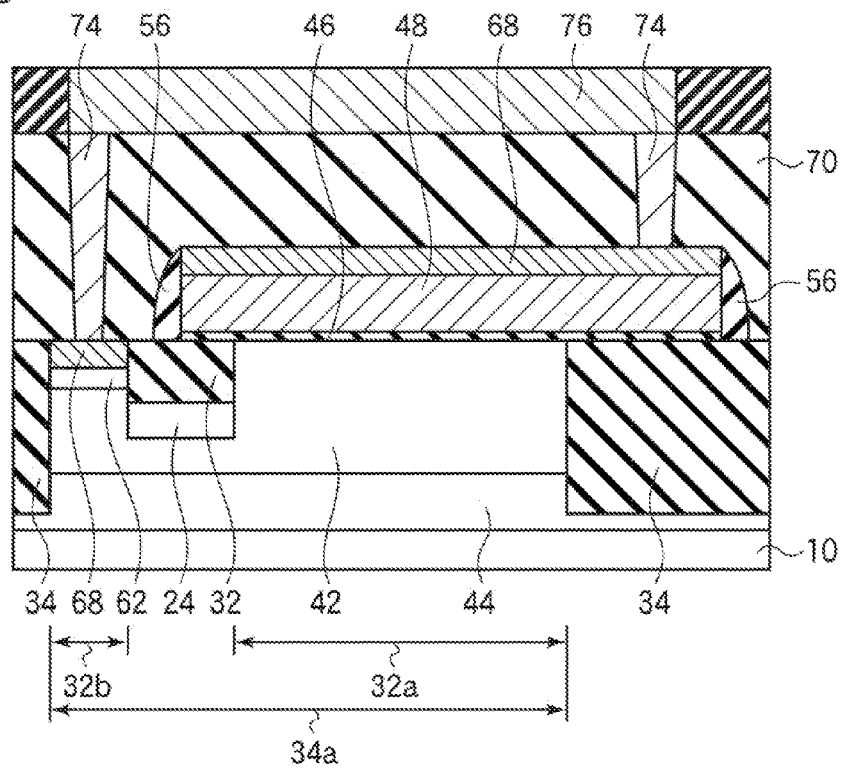

FIG. 1 is a plan view illustrating the structure of the semiconductor device according to the present embodiment. FIGS. 2A and 2B are diagrammatic sectional views illustrating the structure of the semiconductor device according to the present embodiment. FIGS. 3 to 20 are sectional views illustrating the method of manufacturing the semiconductor device according to the present embodiment.

First, the structure of the semiconductor device according to the present embodiment will be described with reference to FIGS. 1 to 2B. FIG. 2A is the sectional view along A-A' line in FIG. 1, and FIG. 2B is the sectional view along C-C' line in FIG. 1.

In a silicon substrate 10, a deep device isolation insulating film 34 for defining active regions 34a where transistors are formed is formed. In the active regions 34a, a shallow device isolation insulating film 32 for defining active regions 32a, 32b in the active region 34a is formed. In FIG. 1, the active region 34a on the right side is an n-channel transistor forming region, and the active region 34a on the left side is a p-channel transistor forming region.

In the silicon substrate 16 in the n-channel transistor forming region, a p-well 42 which is deeper than the bottom of the device isolation insulating film 32 and shallower than the bottom of the device isolation insulating film 34 is formed. Below the p-well 42, an n-well 44 is formed in contact with the device isolation insulating film 34. Thus, the p-well formed in the re-channel transistor forming region is electrically isolated from the rest p-wells not illustrated by the n-well 44 and the device isolation insulating film 34. In the p-well 42, below the bottom of the device isolation insulating film 32, a p-type impurity layer 24 higher doped than the p-well 42 is formed. The bottom of the p-type impurity layer 24 may be located deeper than the bottom of the p-well 42.

Above the active region 32a of the n-channel transistor forming region, a gate electrode 48 is formed with a gate insulating film 46 interposed therebetween. In the active region 32a on both sides of the gate electrode 48, source/drain regions 64 are formed. Above the surface of the active region 32b of the n-channel transistor forming region, a p-type impurity layer 62 electrically connected to the body region below the gate electrode 48 via the p-well 42 and the p-type impurity layer 24 is formed. The p-type impurity layer 62 is a body contact layer for the connection to the body region of the n-channel transistor.

In the silicon substrate 10 in the p-channel transistor forming region, an n-well 36 which is deeper than the bottom of the device isolation insulating film 32 and shallower than the bottom of the device isolation insulating film 34 is formed. Below the n-well 36, a p-well 38 is formed in contact with the device isolation insulating film 34. Thus, the n-well 36 formed in the p-channel transistor forming region is electrically isolated from the rest n-well not illustrated by the p-well 38 and the device isolation insulating film 34. In the n-well 36 below the bottom of the device isolation insulating film 32, an n-type impurity layer (not illustrated) higher doped than the n-well 36 is formed. The n-type impurity layer corresponds to the p-type impurity layer of the n-channel transistor. The bottom of the n-type impurity layer may be located deeper than the bottom of the n-well 36.

Above the active region 32a of the p-channel transistor forming region, a gate electrode 48 is formed with the gate insulating film 46 interposed therebetween. In the active region 32a on both sides of the gate electrode 48, source/drain regions 66 are formed. Above the surface of the active region 32b of the p-channel transistor forming region, an n-type impurity layer 58 electrically connected to the body region below the gate electrode 48 via the n-well and the n-type impurity layer (not illustrated) formed below the device isolation insulating film 32 is formed. The n-type impurity layer 58 is a body contact layer for the connection to the body region of the p-channel transistor.

The section of the p-channel transistor along the extending direction of the gate electrode 48 is the same as the C-C' line section of the n-channel transistor illustrated in FIG. 2B.

Above the gate electrodes 48 and the source/drain regions 64, 66, a metal silicide layer 68 is formed.

Above the silicon substrate 10 with the re-channel transistor and the p-channel transistor formed on, an inter-layer insulating film 70 is formed. In the inter-layer insulating film 70, contact plugs 74 connected to the metal silicide layer 68 formed on the respective electrodes of the transistors are buried.

Above the inter-layer insulating film 70 with the contact plugs 74 buried in, an interconnection 76 interconnecting the gate electrode 48 of the n-channel transistor and the p-type impurity layer via the contact plugs 74 is formed. The interconnection 76 interconnecting the gate electrode 48 of the p-channel transistor and the n-type impurity layer 58 is formed. Interconnections 78 connected to the source/drain regions 64, 66 via the contact plugs 74 are formed.

Thus, the semiconductor device according to the present embodiment is constituted.

As described above, the semiconductor device according to the present embodiment includes the deep device isolation insulating film 34, which defines the active regions 34a of the transistor forming regions. The semiconductor device according to the present embodiment also includes in the active regions 34a the shallow device isolation insulating film 32, which defines the active region 32a to be the channel region and the source/drain regions and the active region 32b to be the body contact region connected to the body region below the channel region. In the well in the region below the device isolation insulating film 32, the impurity layer (e.g., the p-type impurity layer 24 of the n-channel transistor) of a higher concentration which is higher than the impurity concentration at the same depth level of the rest region of the well is formed.

The active region 32a and the active region 32b are divided by the device isolation insulating film 32, which is shallower than the well, whereby one well can be provided for one transistor while the device area can be reduced. The impurity layer is formed below the device isolation insulating film 32, whereby the electric resistance of the region below the device isolation insulating film 32 can be made lower than the electric resistance of the rest region of the well on the same depth level. That is, The impurity layer below the device isolation insulating film 32 can compensate an increase of the well resistance between the active region 32a and the active region 32b due to the presence of the device isolation insulating film 32. Thus, the well resistance between the active region 32a, which is the body region, and the active regions 32b, which is the body contact regions, i.e., the body resistance can be reduced, and the transistor can have the speed increased and the power consumption decreased.

Next, the method of manufacturing the semiconductor device according to the present embodiment will be described with reference to FIGS. 3 to 20.

First, a silicon oxide film 12 of, e.g., an about 3 nm-10 nm thickness is formed by, e.g., thermal oxidation method above the silicon substrate 10. The oxidation temperature is set at, e.g., 850° C.-1000° C.

Next, a silicon nitride film 14 of, e.g., a 70 nm-100 nm thickness is formed by, e.g., LPCVD method above the silicon oxide film 12. The growth temperature is set at, e.g., 700° C.-800° C. (FIG. 3).

Then, the silicon nitride film 14 and the silicon oxide film 12 are patterned by photolithography and dry etching to remove the silicon nitride film 14 and the silicon oxide film 12 in regions for the device isolation insulating films 32, 34 to be formed in (FIG. 4).

Figure 5:
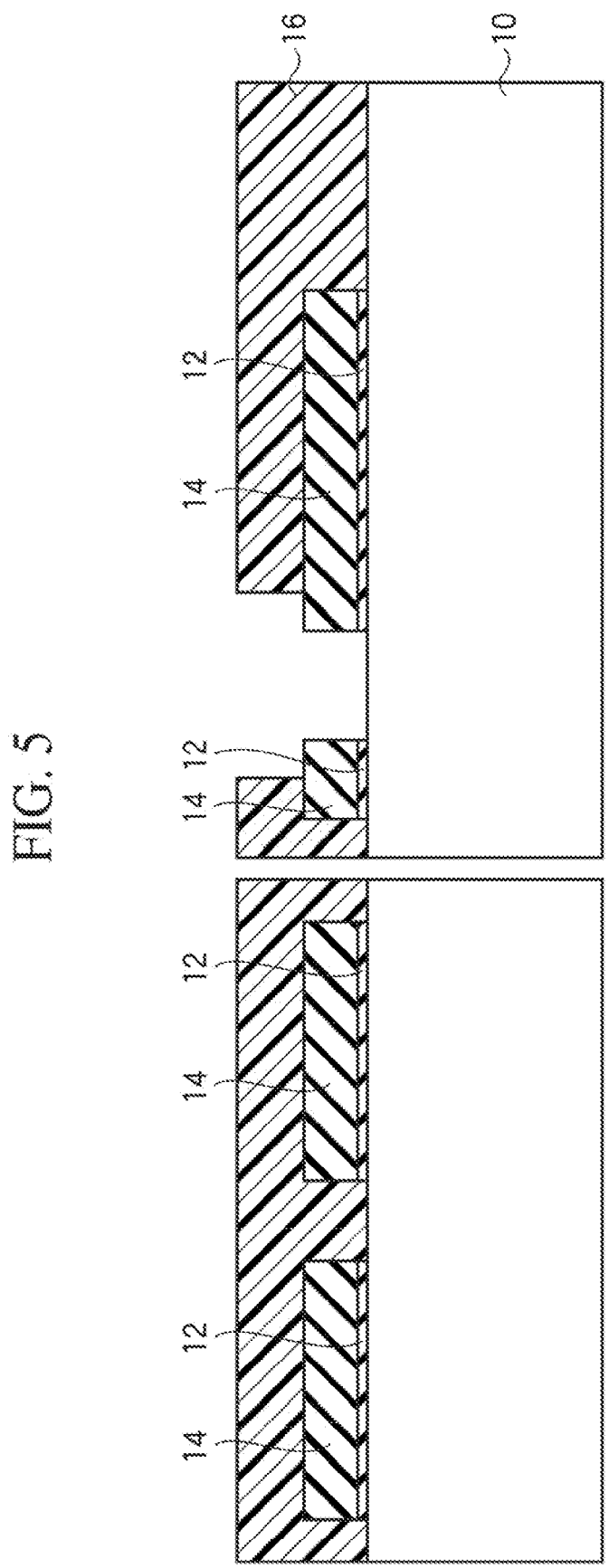

Next, a photoresist film 16 exposing the region for the shallow device isolation insulating film 32 to be formed in, which isolates the active region 32a and the active region 32b, and covering the rest region is formed by photolithography (FIG. 5).

Then, the silicon substrate 10 is dry etched with the photoresist film 16 and the silicon nitride film 14 as the mask to form a device isolation trench 18 of, e.g., a 50 nm-100 nm depth in the region of the silicon substrate 10 for the shallow device isolation insulating film 32 to be formed in.

Figure 6:
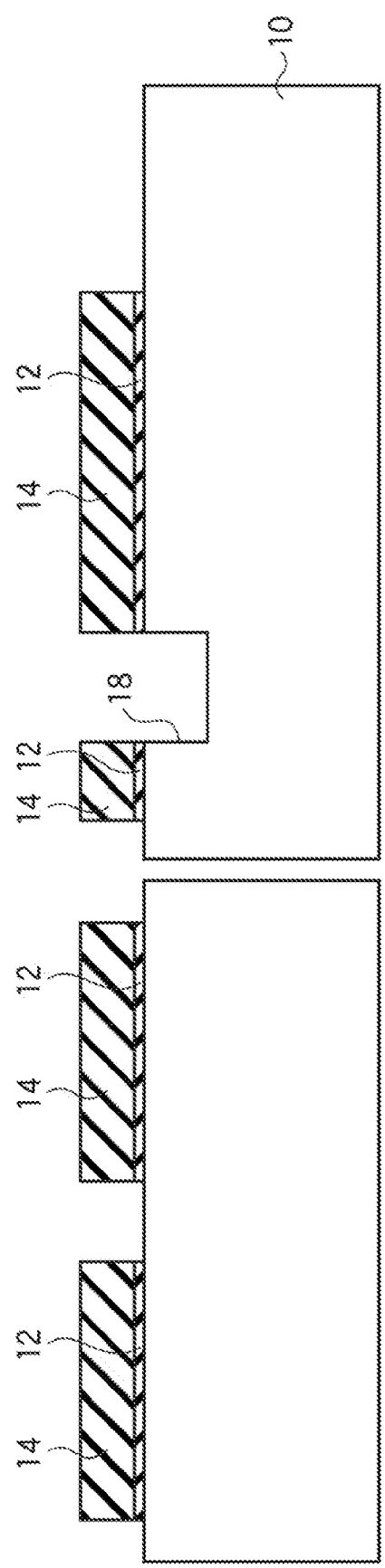

Next, the photoresist film is removed by, e.g., ashing method and SPM cleaning (FIG. 6).

Next, a photoresist film (not illustrated) covering the n-channel transistor forming region and exposing the p-channel transistor forming region is formed by photolithography.

Then, ion implantation is made with this photoresist film and the silicon nitride film 14 as the mask to form an n-type impurity layer 20. The n-type impurity layer 20 is formed by ion-implanting, e.g., arsenic ions ($As^+$) under the conditions, e.g., of a 1 keV-5 keV acceleration energy and a $1 \times 10^{14}$ $cm^{-2}$-$1 \times 10^{15}$ $cm^{-2}$ dose. By this ion implantation, the n-type impurity layer 20 is formed in the bottom of the device isolation trench 18 and the surface of the silicon substrate 10 in the region for the deep device isolation insulating film 34 to be formed in, of the p-channel transistor forming region.

Then, the photoresist film used in forming the n-type impurity layer 20 is removed by, e.g., ashing method.

Next, a photoresist film 22 covering the p-channel transistor forming region and exposing the re-channel transistor forming region is formed by photolithography.

Figure 7:
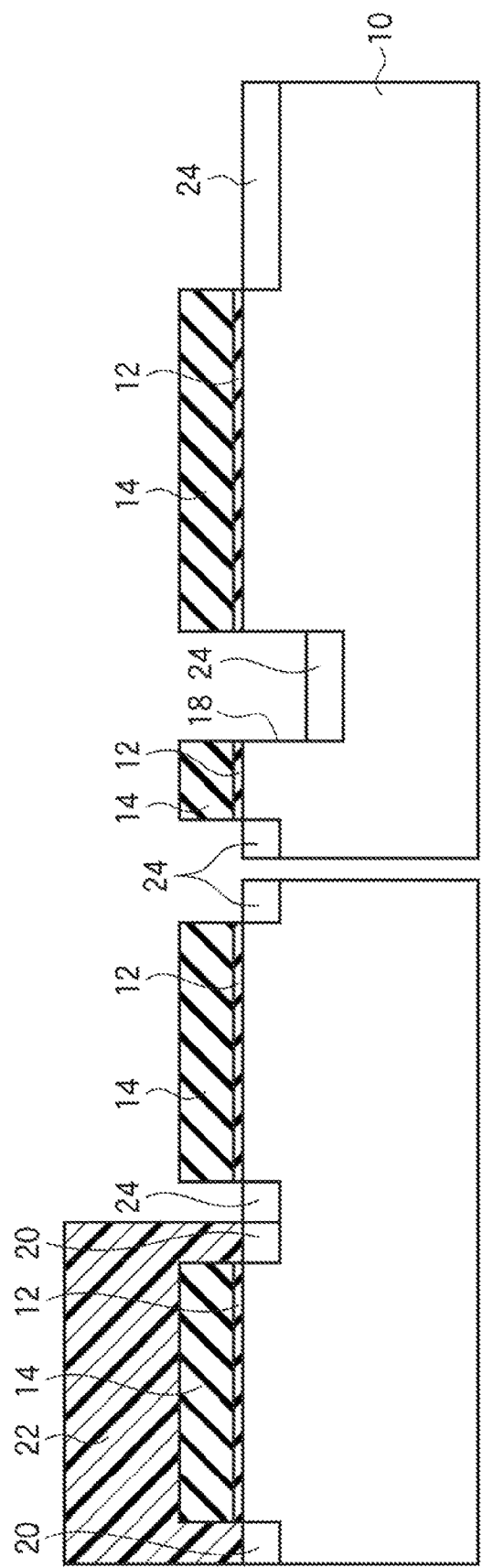

Then, ion implantation is made with the photoresist film 22 and the silicon nitride film 14 as the mask to form a p-type impurity layer 24. The p-type impurity layer 24 is formed by ion-implanting, e.g., boron ions ($B^+$) under the conditions, e.g., of a 0.2 keV-0.6 keV acceleration energy and a $1 \times 10^{14}$ $cm^{-2}$-$1 \times 10^{15}$ $cm^{-2}$ dose. By this ion implantation, the p-type impurity layer 24 is formed in the bottom of the device isolation trench 18 and the surface of the silicon substrate 10 in the region for the deep device isolation insulating film 34 to be formed in, of the n-channel transistor forming region (FIG. 7).

Next, the photoresist film 22 is removed by, e.g., ashing method.

In the present embodiment, the n-type impurity layer 20 and the p-type impurity layer 24 are formed also in the surface of the silicon substrate 10 in the region for the deep device isolation insulating film 34 to be formed in, but the n-type impurity layer 20 and the p-type impurity layer 24 in the region for the deep device isolation insulating film to be formed in are not essential. That is, the region for the deep device isolation insulating film 34 to be formed in may be covered by the photoresist film to be used as the mask in forming the n-type impurity layer 20 and the p-type impurity layer 24. In this case, the device isolation trench 18 can be formed after the device isolation trench 28 has been formed.

Figure 8:
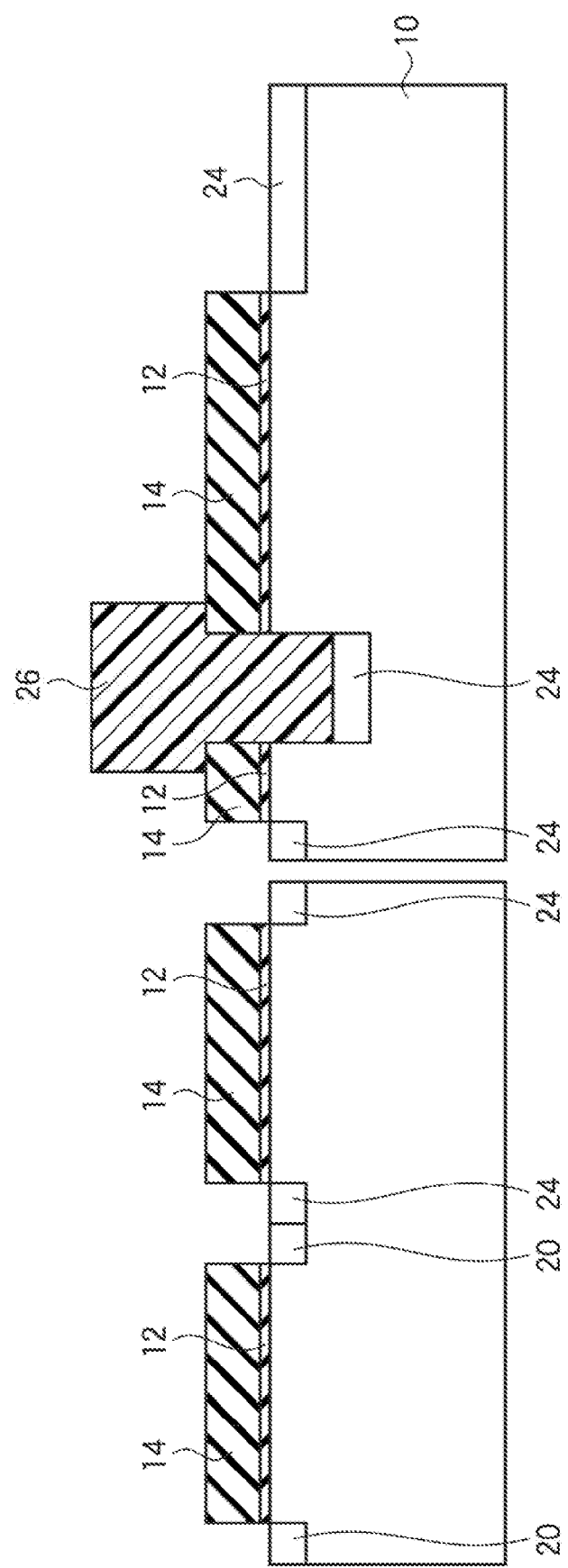

Then, a photoresist film 26 covering the region where the device isolation trench 18 has been formed and exposing the region for the deep device isolation insulating film to be formed in is formed by photolithography (FIG. 8).

Next, the silicon substrate 10 is dry etched with the photoresist film 26 and the silicon nitride film 14 as the mask to form the device isolation trench 28 of, e.g., a 250 nm-400 nm depth in the region of the silicon substrate where the deep device isolation insulating film 34 is to be formed in.

Figure 9:
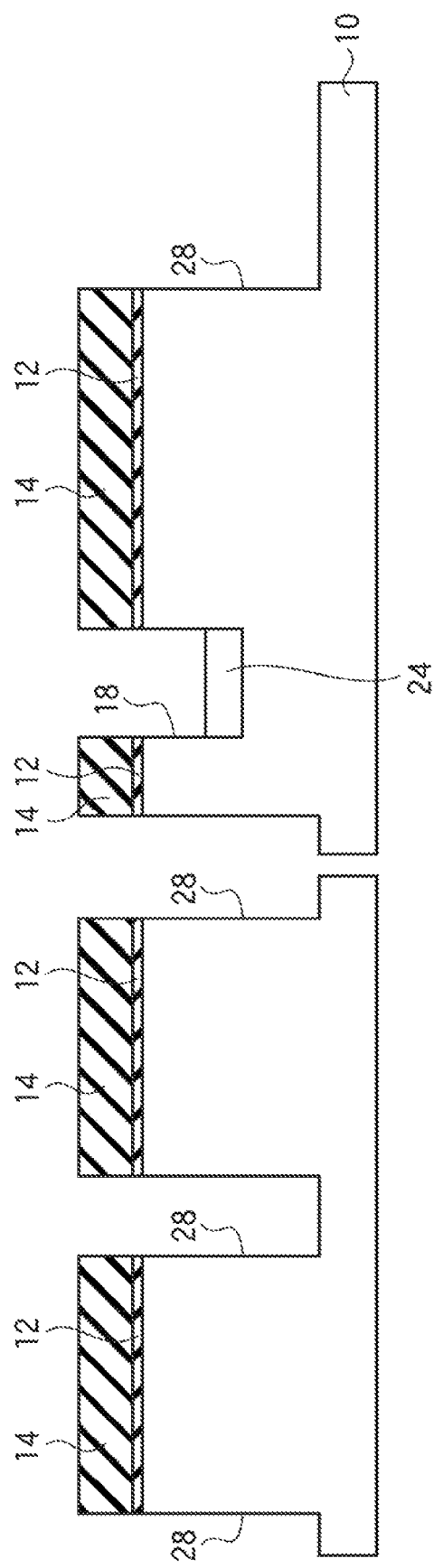

Next, the photoresist film 26 is removed by, e.g. ashing method (FIG. 9).

Figure 10:
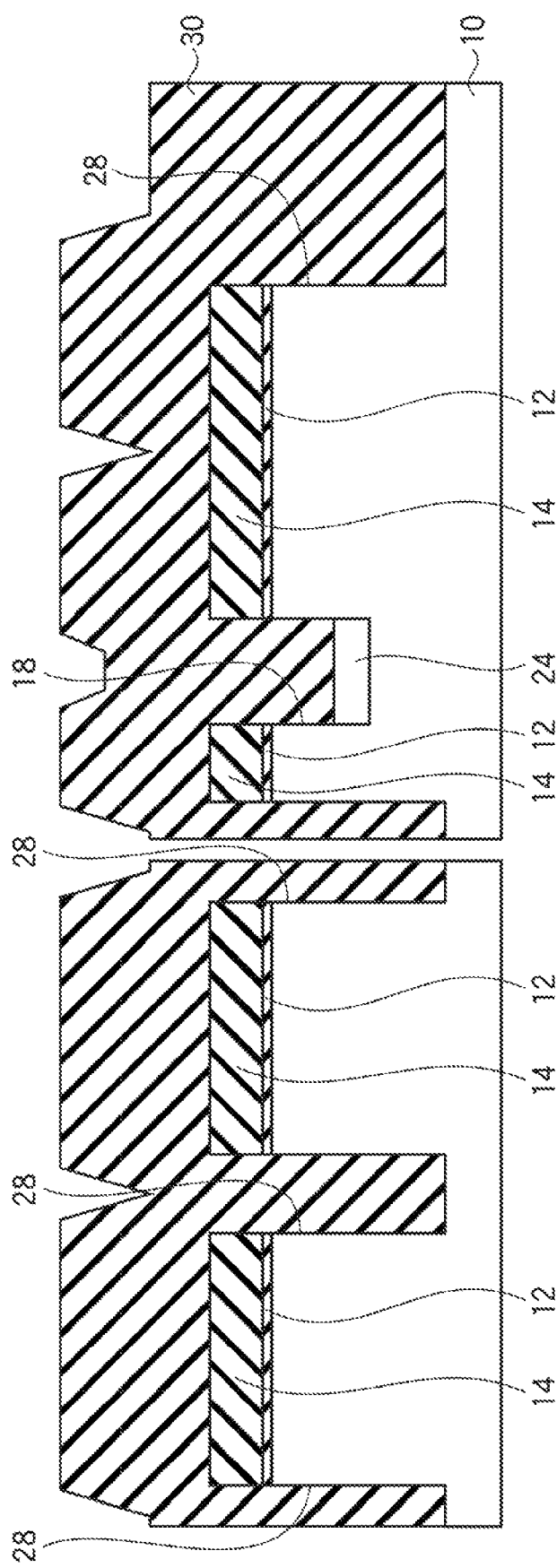

Next, a silicon oxide film 30 of a thickness sufficient to fill the device isolation trenches 18, 28 is deposited above the entire surface by, e.g., high density plasma CVD method (FIG. 10).

Then, the silicon oxide film 30 above the silicon nitride film 14 is removed by, e.g., CMP (Chemical Mechanical Polishing) method. Thus, the shallow device isolation insulating film 32 formed of the silicon oxide film 30 buried in the device isolation trench 18 and the deep device isolation insulating film 34 formed of the silicon oxide film 30 buried in the device isolation trench 28 is formed by the so-called STI (Shallow Trench Isolation) method.

Figure 11:
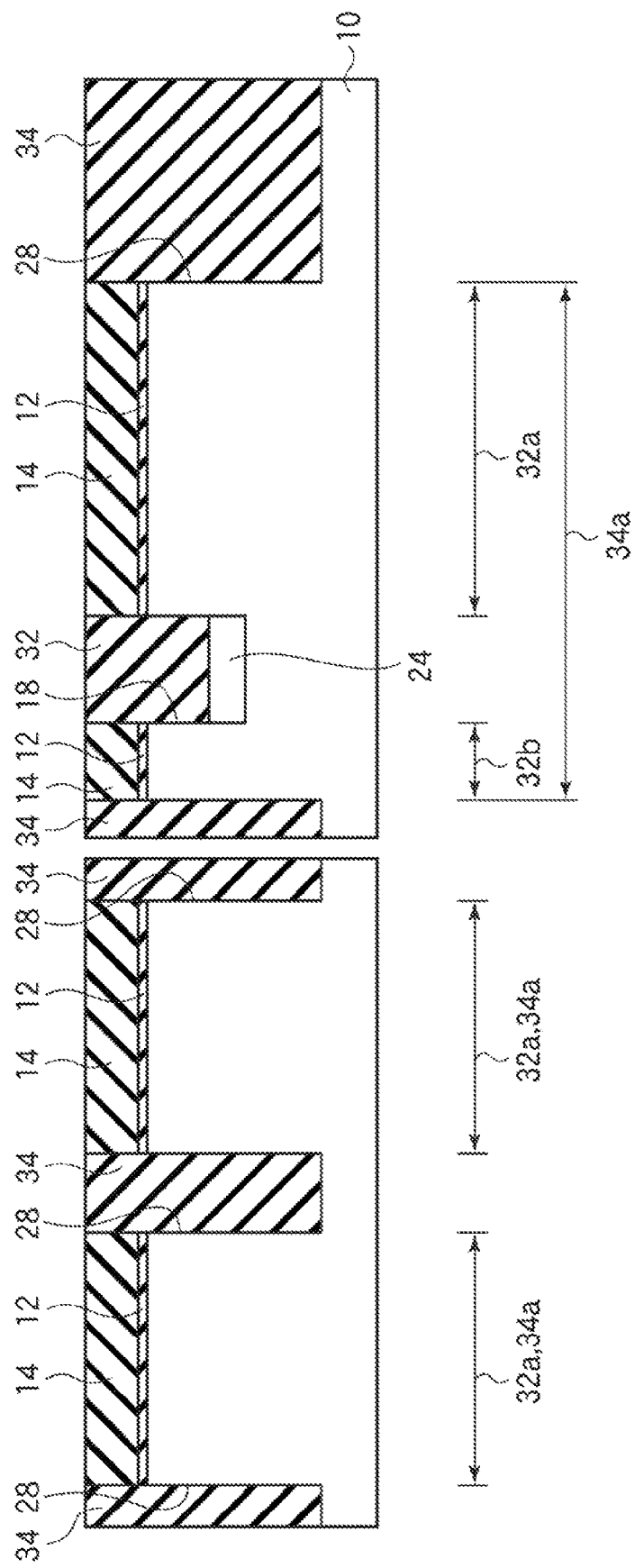

Thus, the active region 34a where each transistor region is formed is defined by the device isolation insulating film 34. The active region 32a and the active region 32b are defined in each active region 34a by the device isolation insulating film 32 (FIG. 11).

Next, the surfaces of the device isolation insulating films 32, 34 are etched by a prescribed quantity by wet etching with the silicon nitride film 14 as the mask and using, e.g., hydrofluoric acid aqueous solution. This etching is for adjusting the surfaces of the active regions and the surfaces of the device isolation insulating films 32, 34 to be substantially on the same height level in the completed transistor.

Next, the silicon nitride film 14 is removed by wet etching using, e.g., boiled phosphoric acid.

Figure 12:
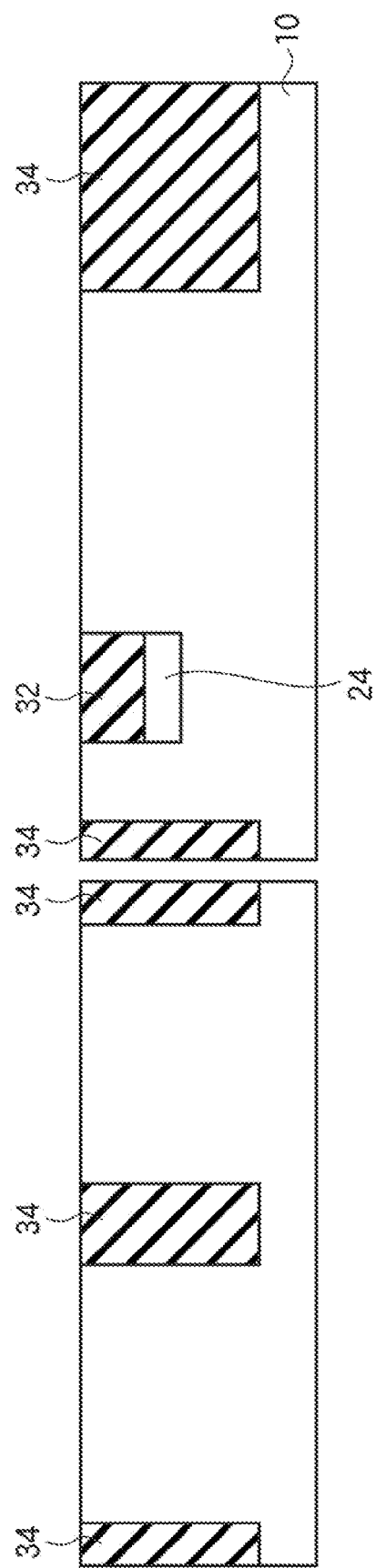

Next, the silicon oxide film 12 is removed by wet etching using, e.g., hydrofluoric acid aqueous solution (FIG. 12).

Then, a silicon oxide film (not illustrated) to be the protection film in ion implantation is formed above the surface of the silicon substrate 10 by, e.g., thermal oxidation method.

Then, a photoresist film (not illustrated) covering the n-channel transistor forming region and exposing the p-channel transistor forming region is formed by photolithography.

Next, ion implantation is made with this photoresist film as the mask to form an n-well 36 and a p-well 38. The n-well 36 is formed in the region which is deeper than the n-type impurity layer 20 below the device isolation insulating film 32 and shallower than the bottom of the device isolation insulating film 34. The p-well 38 is formed in the region deeper than the n-well 36 in contact with the device isolation insulating film 34. Thus, each n-well 36 formed in each transistor region is electrically isolated by the p-well 38 and the device isolation insulating film 34.

The N-well 36 is formed by ion-implanting, e.g., phosphorus ions ($P^+$) under the conditions, e.g., of a 70 keV-120 keV acceleration energy and a $5\times10^{12}$ cm'-$3\times10^{13}$ cm$^{-2}$ dose or by ion-implanting, e.g., arsenic ions under the conditions, e.g., of a 100 keV-250 keV acceleration energy and a $5\times10^{12}$ cm$^{-2}$-$3\times10^{13}$ cm$^{-2}$ dose. At this time, both phosphorus ions and arsenic ions may be ion-implanted to form the well. The p-well 38 is formed by ion-implanting, e.g., boron ions under the conditions, e.g., of a 100 keV-200 keV acceleration energy and a $7\times10^{12}$ cm$^{-2}$-$3\times10^{13}$ cm$^{-2}$ dose.

Then, the photoresist film used in forming the n-well 36 and the p-well 38 is removed by, e.g., asking method.

Next, a photoresist film 40 covering the p-channel transistor forming region and exposing the re-channel transistor forming region is formed by photolithography.

Figure 13:
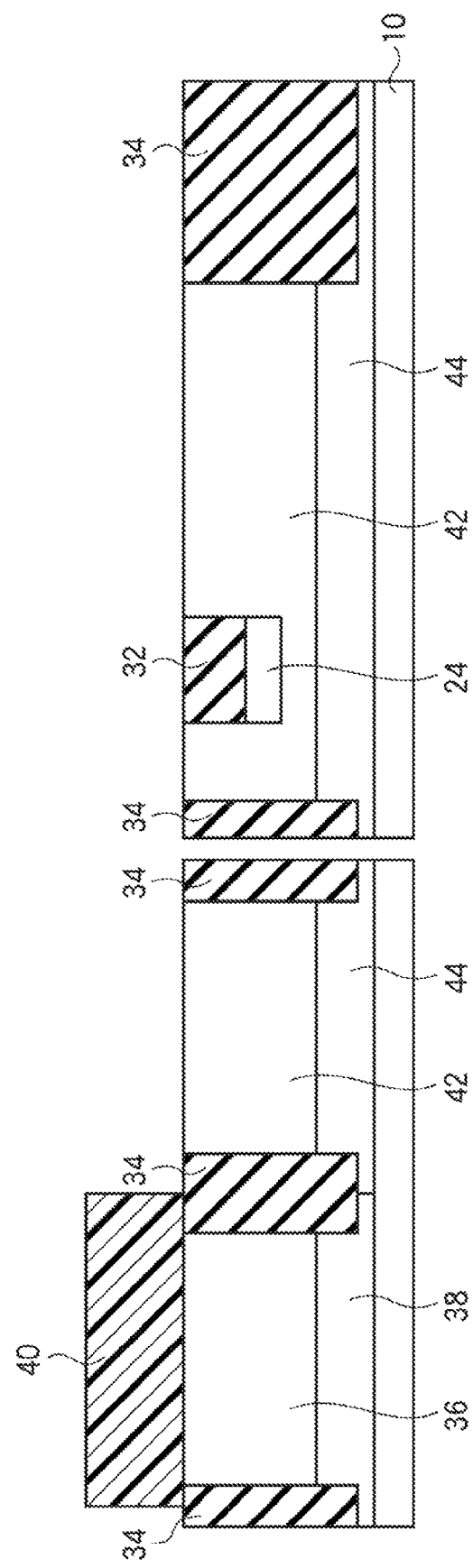

Then, ion implantation is made with the photoresist film 40 as the mask to form a p-well 42 and an n-well 44 (FIG. 13). The p-well 42 is formed in the region which is deeper than the p-type impurity layer below the device isolation insulating film 32 and shallower than the bottom of the device isolation insulating film 34. The n-well 44 is formed in the region deeper than the p-well 42 in contact with the device isolation insulating film 34. Thus, the each p-well 42 formed in each transistor region is electrically isolated by the p-well 44 and the device isolation insulating film 34.

The p-well 42 is formed by ion-implanting, e.g., boron ions under the conditions, e.g., of a 20 keV-50 keV acceleration energy and a $5\times10^{12}$ cm$^{-2}$-$3\times10^{13}$ cm$^{-2}$ dose. The n-well 44 is formed by ion-implanting, e.g., phosphorus ions under the conditions, e.g. of a 200 keV-400 keV acceleration energy and a $7\times10^{12}$ cm$^{-2}$-$3\times10^{13}$ cm$^2$ dose.

Then, the photoresist film 40 is removed by, e.g., asking method.

Next, thermal processing is made in an inert atmosphere to activate the implanted impurities. For example, rapid thermal processing of 900° C.-1100° C. and 3 seconds-10 seconds is made in nitrogen atmosphere.

In the manufacturing method according to the present embodiment, ion implantation is made selectively in the bottom of the device isolation trench 18 to form the n-type impurity layer 20 and the p-type impurity layer 28 separately from the ion implantation for forming the wells, whereby the impurity profiles of the well except on the bottom of the device isolation insulating film 32 is never influenced. The n-type impurity layer 20 and the p-type impurity layer 24 can be formed in the bottom of the device isolation trench 18 in self-alignment by using the process of forming the device isolation insulating films 32, 34, whereby the manufacturing cost is not much increased.

Next, the silicon oxide film (not illustrated) as the protection film is removed by wet etching using, e.g., hydrofluoric acid aqueous solution.

Next, the surface of the silicon substrate 10 is thermally oxidized at a temperature of, e.g., 750° C.-1100° C. to form a gate insulating film 46 of a silicon oxide film.

Next, a polycrystalline silicon film is deposited above the gate insulating film 46 by, e.g., LPCVD method.

Figure 14:
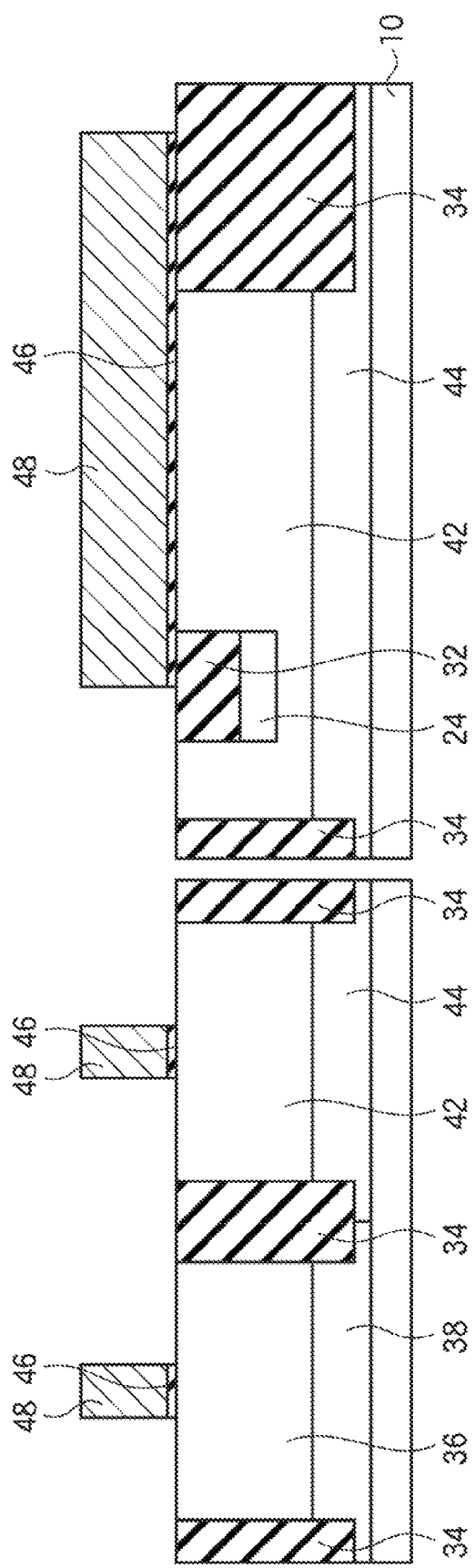

Then, the polycrystalline silicon film is patterned by photolithography and dry etching to form gate electrodes 48 of the polycrystalline silicon film (FIG. 14).

Next, a photoresist film (not illustrated) covering the n-channel transistor forming region and the active region 32b of the p-channel transistor forming region and exposing the active region 32a of the p-channel transistor forming region is formed by photolithography.

Next, ion implantation is made with this photoresist film and the gate electrodes 48 as the mask to form a p-type impurity layer 50 to be extension regions. As required, n-type pocket regions may be formed together with the p-type impurity layer 50.

Next, the photoresist film used in forming the p-type impurity layer 50 is removed by, e.g., ashing method.

Next, a photoresist film 52 covering the p-channel transistor forming region and the active region 32b of the n-channel transistor forming region and exposing the active region 32a of the n-channel transistor forming region is formed by photolithography.

Figure 15:
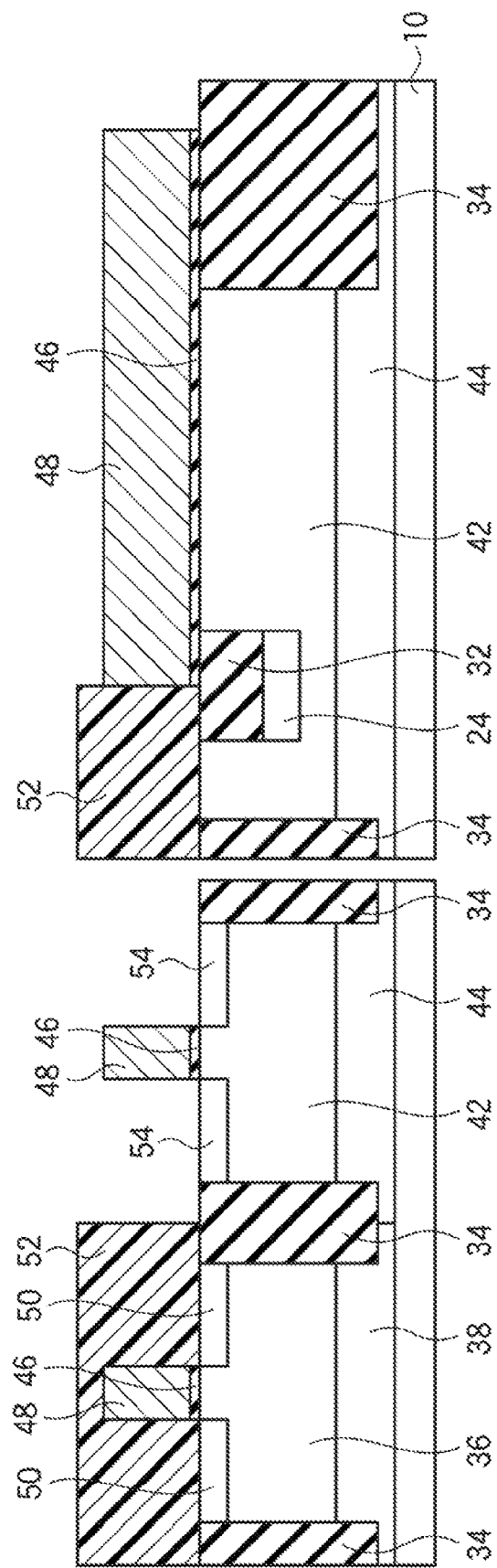

Next, ion implantation is made with the photoresist film 52 and the gate electrodes 48 as the mask to form an n-type impurity layer 54 to be extension regions (FIG. 15). As required, the p-type pocket regions may be formed together with the n-type impurity layer 54.

Next, the photoresist film 52 is removed by, e.g., ashing method.

Then, a silicon oxide film is deposited above the entire surface by, e.g., CVD method. The processing condition is, e.g., a temperature of 400° C.-600° C. In place of the silicon oxide film, silicon nitride film may be deposited.

Figure 16:
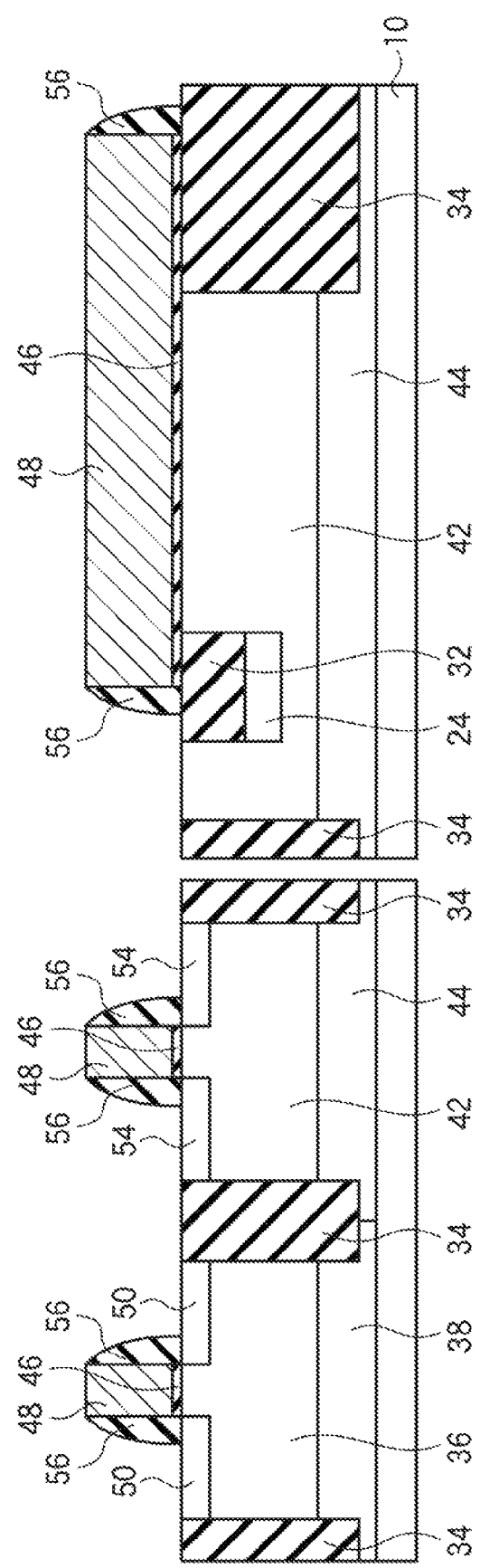

Then, the silicon oxide film deposited above the entire surface is anisotropically etched to be left selectively on the side walls of the gate electrodes 48. Thus, the sidewall spacers 56 of the silicon oxide film are formed (FIG. 16).

Next, a photoresist film (not illustrated) exposing the active region 32a of the n-channel transistor forming region and the active region 32b of the p-channel transistor forming region and covering the rest region is formed.

Next, ion implantation is made with this photoresist film, the gate electrodes 48 and the sidewall spacers 56 as the mask. Thus, an n-type impurity layer 58 forming the source/drain regions 64 with the n-type impurity layer 54 of the n-channel transistor is formed in the active region 32a of the n-channel transistor forming region. In the active region 32b of the p-channel transistor forming region, an n-type impurity layer 58 to be the body contact region is formed.

Next, the photoresist film used in forming the n-type impurity layer 58 is removed by, e.g., ashing method.

Then, a photoresist film 60 exposing the active region 32a of the p-channel transistor forming region and the active region 32b of the n-channel transistor forming region and covering the reset region is formed.

Figure 17:
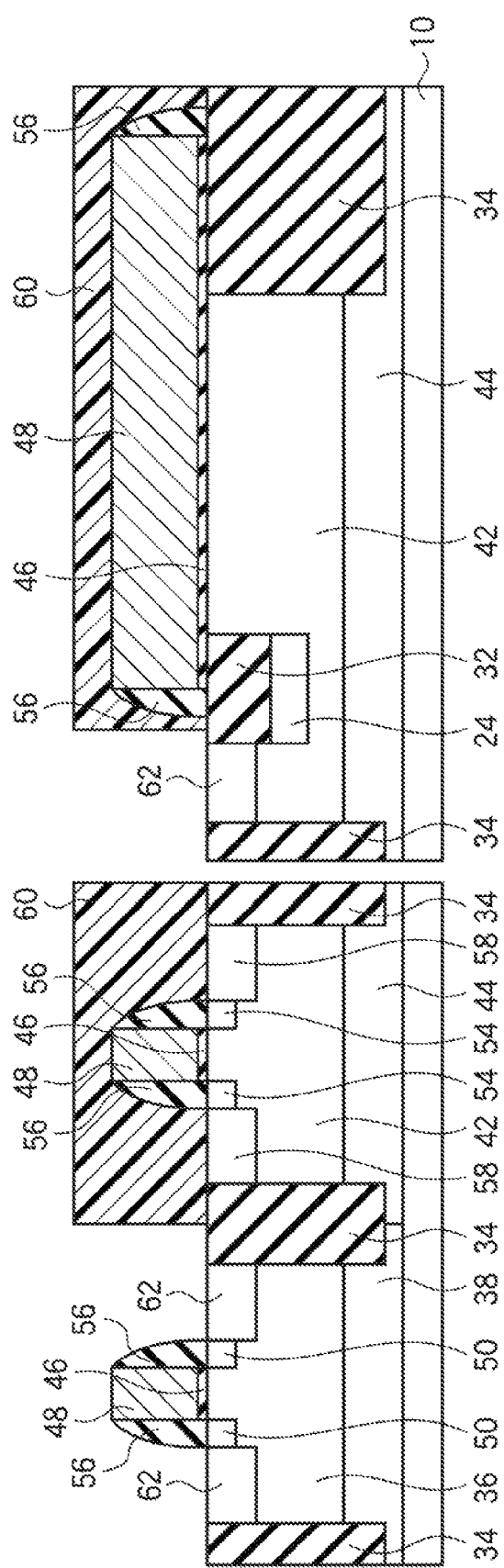

Then, ion implantation is made with the photoresist film 60, the gate electrodes 48 and the sidewall spacers 56 as the mask. Thus, in the active region 32a of the p-channel transistor forming region, a p-type impurity layer 62 forming the source/drain regions 66 with the p-type impurity layer 50 of the p-channel transistor is formed. In the active region 32b of the re-channel transistor forming region, a p-type impurity layer 62 to be the body contact region is formed (FIG. 17).

Next, the photoresist film 60 is removed by, e.g., ashing method.

Then, thermal processing is made in an inert atmosphere to activate the implanted impurities. For example, spike annealing of 900° C.-1100° C. is made in nitrogen atmosphere. Thus, the source/drain regions 64 of the n-channel transistor including the n-type impurity layer 54 and the n-type impurity layer 58, and the source/drain regions 66 of the p-channel transistor including the p-type impurity layer 50 and the p-type impurity layer 62 are formed.

Next, a metal silicide layer 68 is formed selectively above the source/drain regions 64, 66 and above the gate electrodes 48 by salicide (self-aligned silicide) process. As a metal material for forming the metal silicide layer 68, titanium (Ti), cobalt (Co), nickel (Ni) or others, for example, can be used.

Figure 18:
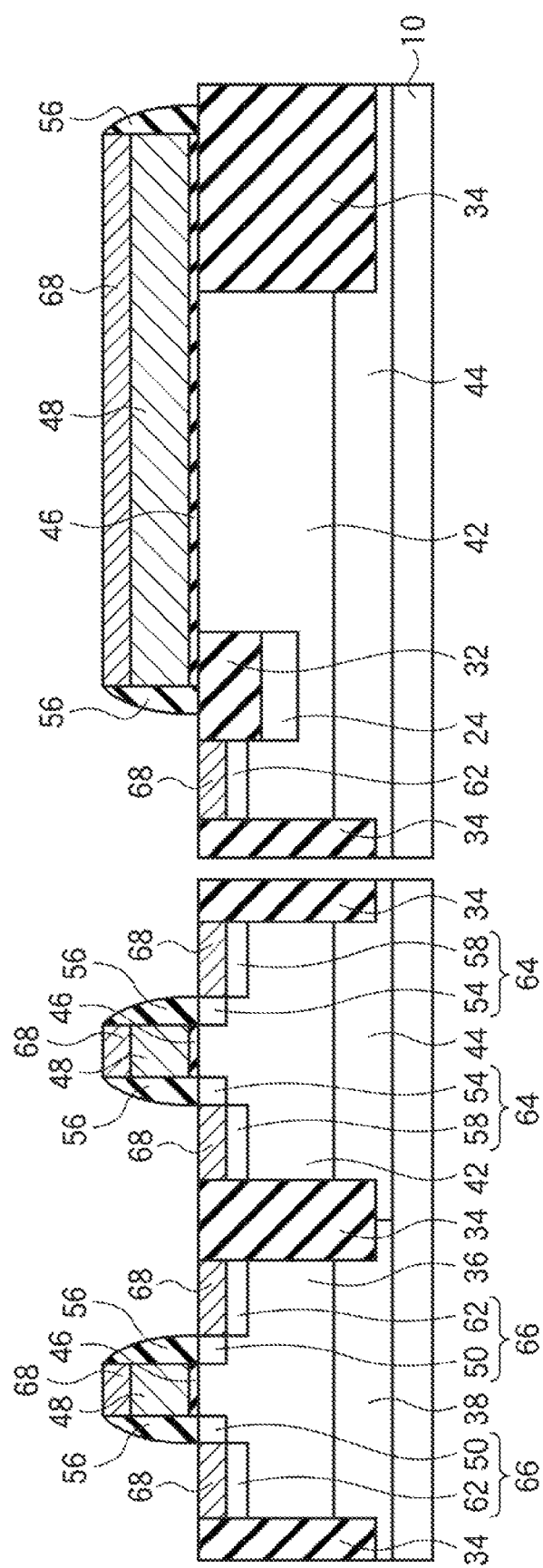

Thus, above the silicon substrate 10, an re-channel transistor including the gate electrode 48 and the source/drain regions 64, and a p-channel transistor including the gate electrode 48 and the source/drain regions 66 are formed (FIG. 18).

Next, above the silicon substrate 10 with the re-channel transistor and the p-channel transistor formed on, an insulating film of a silicon oxide film or others and silicon nitride film for a contact-etching-stopper is deposited by, e.g., CVD method to form the inter-layer insulating film 70.

Then, the surface of the inter-layer insulating film 70 is planarized by, e.g., CMP method.

Figure 19:
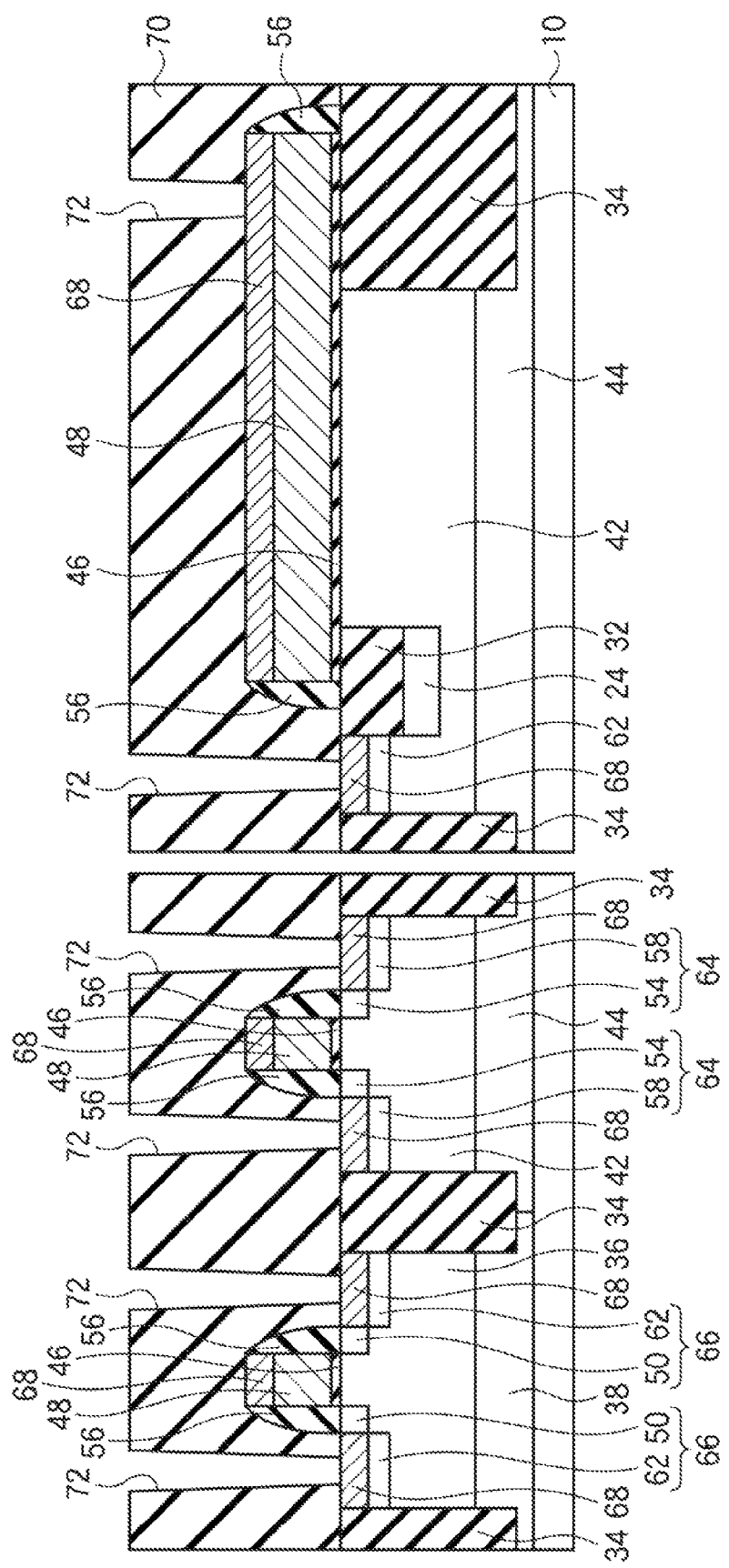

Next, contact holes 72 down to the metal silicide layer 68 formed on the respective electrodes of the n-channel transistor and the p-channel transistor are formed in the inter-layer insulating film 70 by photolithography and dry etching (FIG. 19).

Next, contact plugs 74 including, e.g., barrier metal and tungsten are formed in the contact holes 72.

Figure 20:
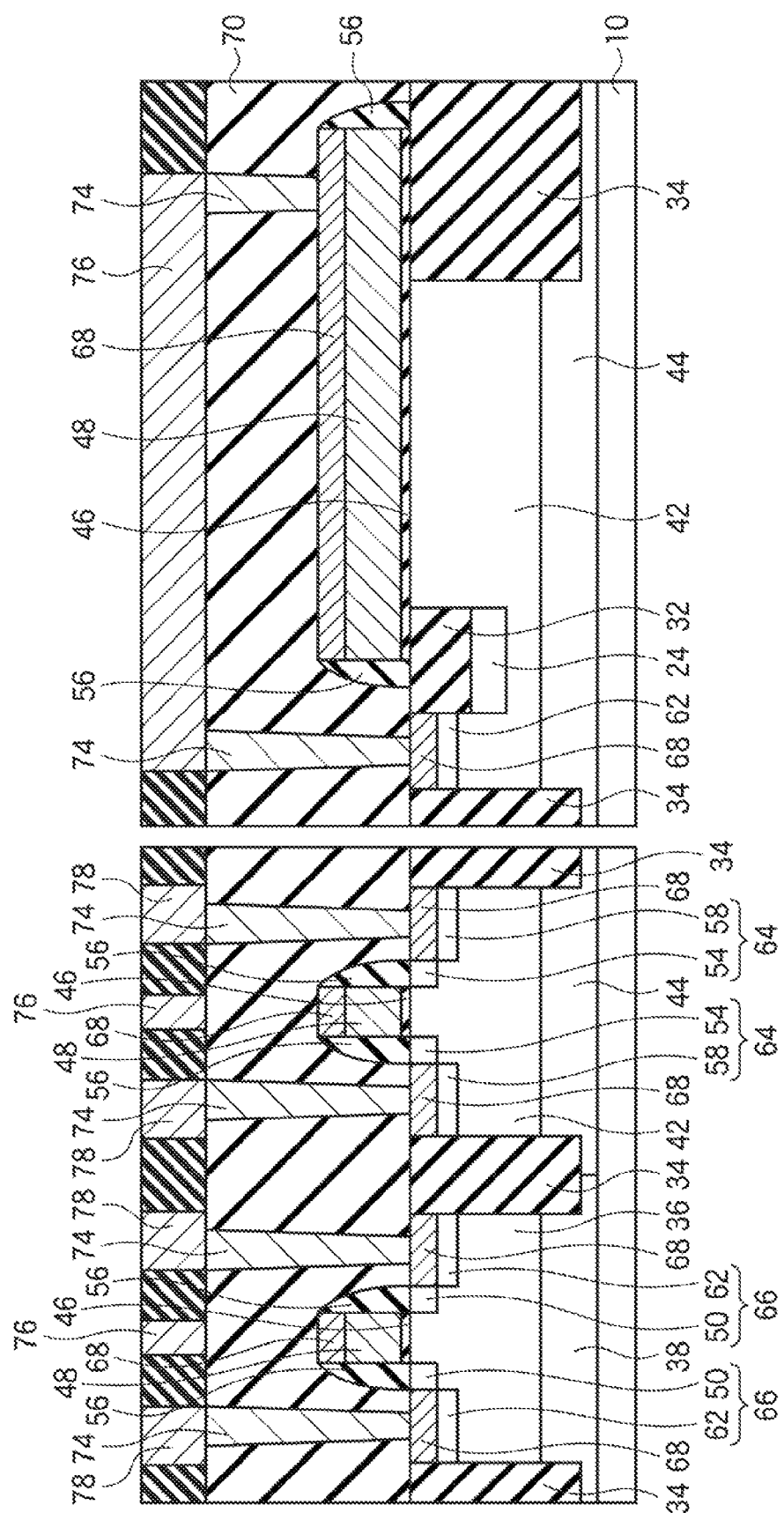

Next, above the inter-layer insulating film 70 with the contact plugs 74 buried in, the interconnections 76 electrically connecting the gate electrode 48 and the body contact region 32b via the contact plugs 74 are formed. The interconnections 78, etc. connected to the source/drain regions 66, 68 via the contact plugs 74 are formed (FIG. 20).

Hereafter, a required backend process is made, and the semiconductor device according to the present embodiment is completed.

As described above, according to the present embodiment, in the transistor having the gate electrode and the body region connected, the impurity layer is formed in the bottom of the device isolation insulating film formed between the body region and the body contact region, whereby the body resistance can be drastically decreased. Thus, the transistor can have the speed increased and the power consumption decreased.

The impurity layer in the bottom of the device isolation insulating film is formed by ion-implanting selectively in the bottom of the device isolation trench 18 separately from the ion-implantation for forming the wells, whereby the impurity profile of the well except in the bottom of the device isolation insulating film 32 are never influenced. Accordingly, the impurity concentration of the impurity layer in the bottom of the device isolation insulating film can be suitably set corresponding to a required value of the body resistance. The impurity layer in the bottom of the device isolation insulating film is formed in the bottom of the device isolation trench in self-alignment by using the process of forming the device isolation insulating film, which never much increases the manufacturing cost.

A Second Embodiment

A method of manufacturing a semiconductor device according to a second embodiment will be described with reference to FIGS. 21 to 27. The same members of the present embodiment as those of the semiconductor device and the method of manufacturing the same according to the first embodiment illustrated in FIGS. 1 to 20 are represented by the same reference numbers not to repeat or to simplify their description.

FIGS. 21 to 27 are sectional views illustrating the method of manufacturing the semiconductor device according to the present embodiment.

In the present embodiment, another method of manufacturing the semiconductor device according to the first embodiment illustrated in FIGS. 1 to 2B will be described. The method of manufacturing the semiconductor device according to the present embodiment is different from the method of manufacturing the semiconductor device according to the first embodiment in the process of forming the device isolation insulating films 32, 34 but are the same in the rest.

First, in the same way as in the method of manufacturing the semiconductor device according to the first embodiment illustrated in FIGS. 3 and 4, the silicon oxide film 12 and the silicon nitride film 14 are formed above the silicon substrate 10.

Next, the silicon nitride film 14 and the silicon oxide film 12 are patterned by photolithography and dry etching to remove the silicon nitride film 14 and the silicon oxide film 12 in the regions for the device isolation insulating films 32, 34 to be formed in.

Figure 21:
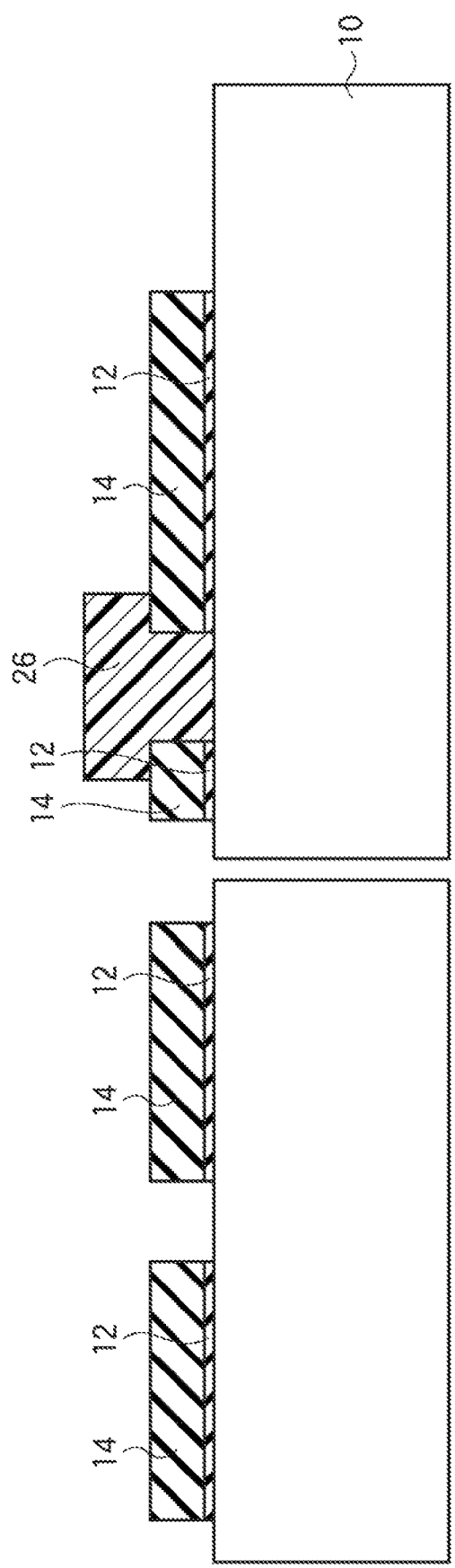
FIGS. 21 to 27 are sectional views illustrating a method of manufacturing a semiconductor device according to a second embodiment.

Next, a photoresist film 26 for covering the region for the shallow device isolation insulating film 32 isolating the active region 32a and the active region 32b is formed by photolithography (FIG. 21).

Next, the silicon substrate 10 is dry etched with the photoresist film 26 and the silicon nitride film 14 as the mask to form the device isolation trench 28 of, e.g., a 200 nm-300 nm depth in the region of the silicon substrate 10 for the deep device isolation insulating film 34 to be formed in.

Figure 22:
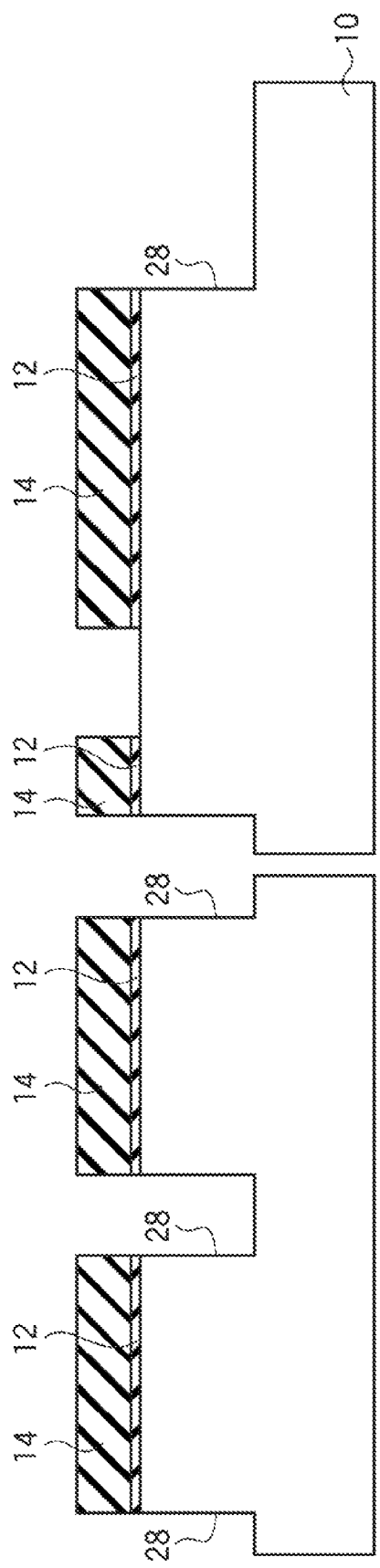
Figure 23:
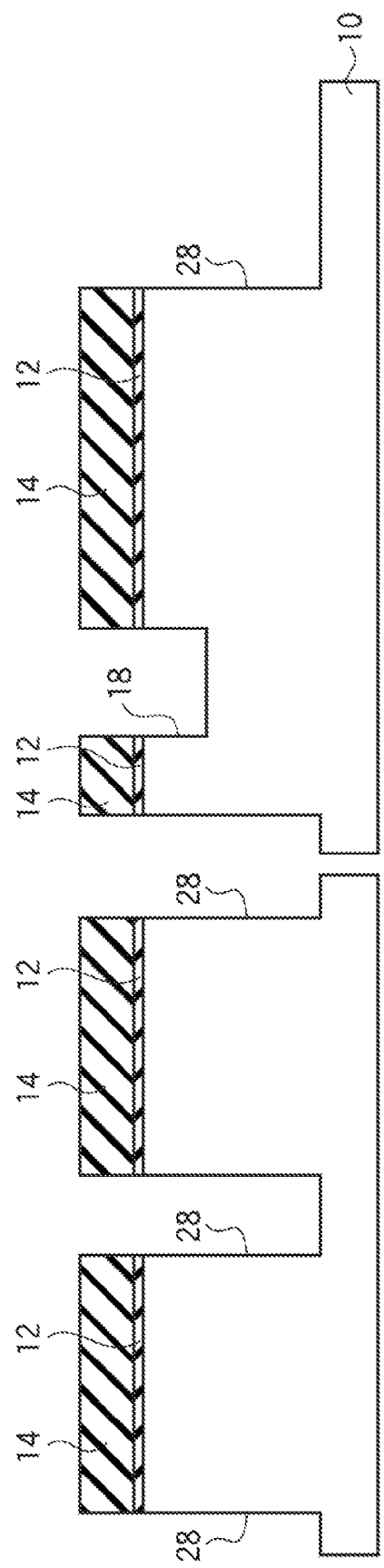

Then, the photoresist film 26 is removed by, e.g., asking method (FIG. 22).

Then, the silicon substrate 10 is dry etched with the silicon nitride film 14 as the mask to form the device isolation trench 18 of, e.g., a 50 nm-100 nm depth in the region of the silicon substrate 10 for the shallow device isolation insulating film 32 to be formed in. Simultaneously therewith, the device isolation trench 28 is further etched to form the device isolation trench 28 of, e.g., a 250 nm-400 nm depth.

Figure 24:
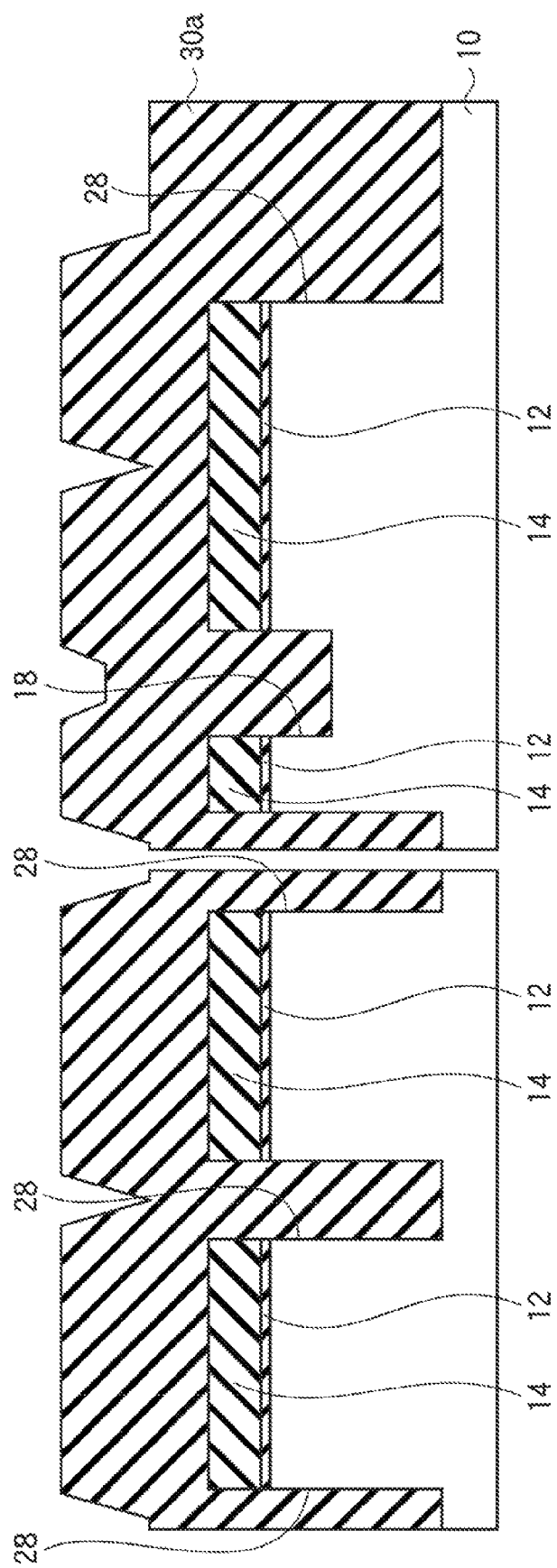

Next, by, e.g., high density plasma CVD method, the silicon oxide film 30a is deposited in a film thickness sufficient to fill the device isolation trenches 18, 28 (FIG. 24).

Figure 25:
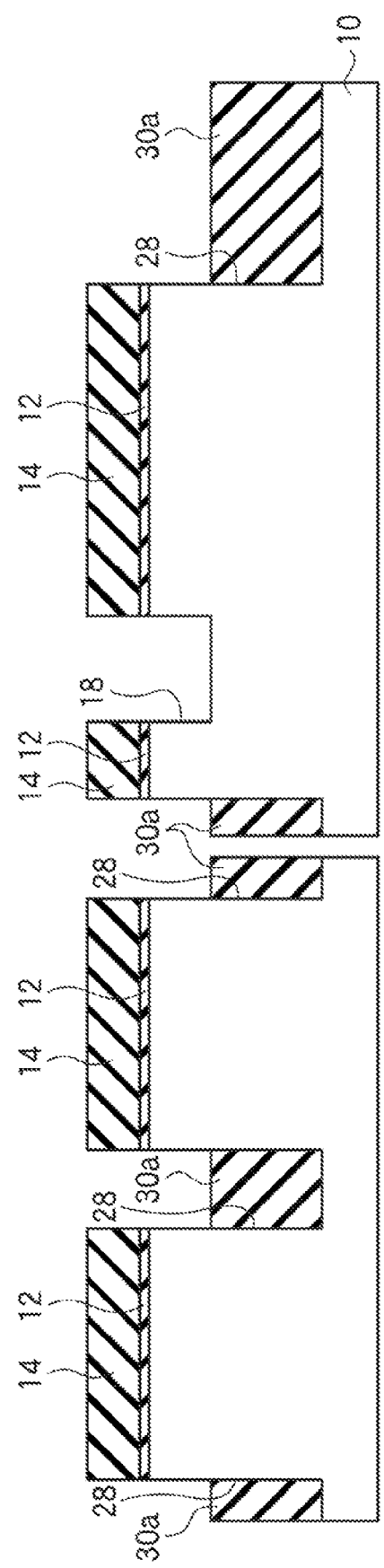

Next, the silicon oxide film 30a is etched back. This etching back is set on until the bottom of the device isolation trench 18 is exposed, and the bottom of the device isolation trench 28 is covered by the silicon oxide film 30a (FIG. 25).

Next, a photoresist film (not illustrated) covering the n-channel transistor forming region and exposing the p-channel transistor forming region is formed by photolithography.

Then, ion implantation is made with this photoresist film and the silicon nitride film 14 as the mask to form the n-type impurity layer (not illustrated). By this ion implantation, the n-type impurity layer is formed in the bottom of the device isolation trench 18 in the p-channel transistor forming region.

Next, the photoresist film used in forming the n-type impurity layer is removed by, e.g., asking method.

Next, a photoresist film 22 covering the p-channel transistor forming region and the exposing the re-channel transistor forming region is formed by photolithography.

Figure 26:
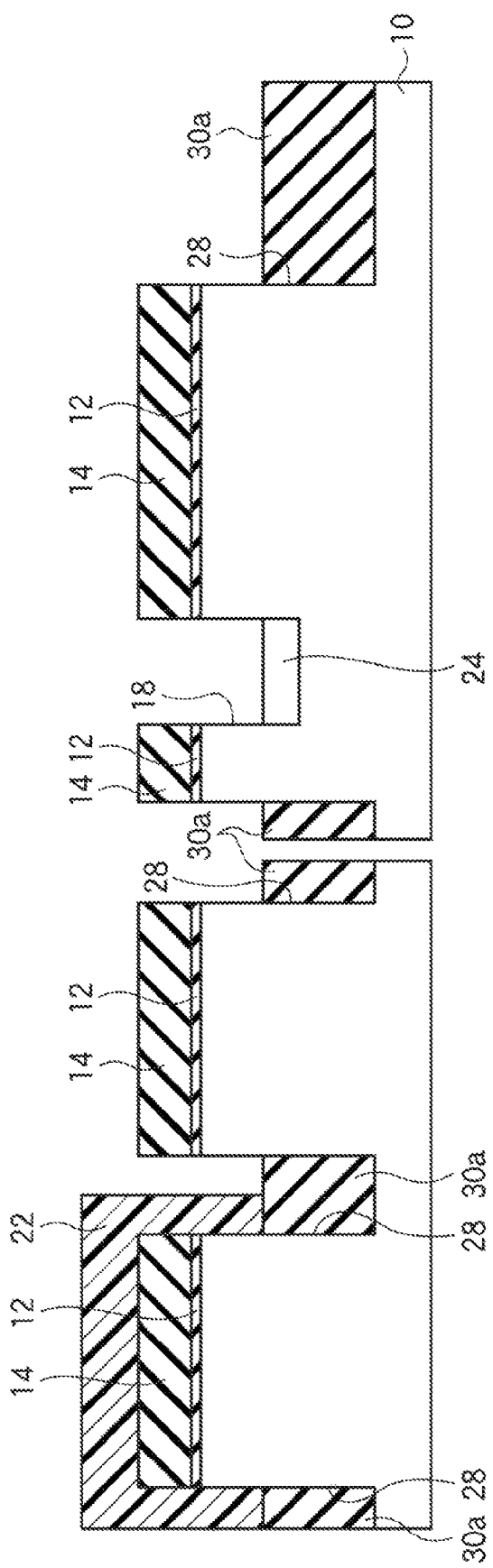

Then, ion-implantation is made with the photoresist film 22 and the silicon nitride film 14 as the mask to form the p-type impurity layer 24. By this ion-implantation, the p-type impurity layer 24 is formed in the bottom of the device isolation trench 18 in the re-channel transistor forming region (FIG. 26).

Next, the photoresist film 22 is removed by, e.g., asking method.

It is an idea that the device isolation trench 28 is covered by the photoresist film when the n-type impurity layer and the p-type impurity layer 24 are formed in the bottom of the device isolation trench 18. In this case, if disalignment should take place, a region where the n-type impurity layer or the p-type impurity layer 24 is not formed in the bottom of the device isolation trench 18 will be formed, or the n-type impurity layer or the p-type impurity layer 24 will be formed in the bottom of the device isolation trench 28.

On the other hand, in the method of manufacturing the semiconductor device according to the present embodiment, the bottom of the device isolation trench 28 is covered by the silicon oxide film 30a in self-alignment. Thus, the n-type impurity layer and the p-type impurity layer 24 can be formed in the bottom of the device isolation trench 18 without being influenced by disalignment in the photolithography.

Figure 27:
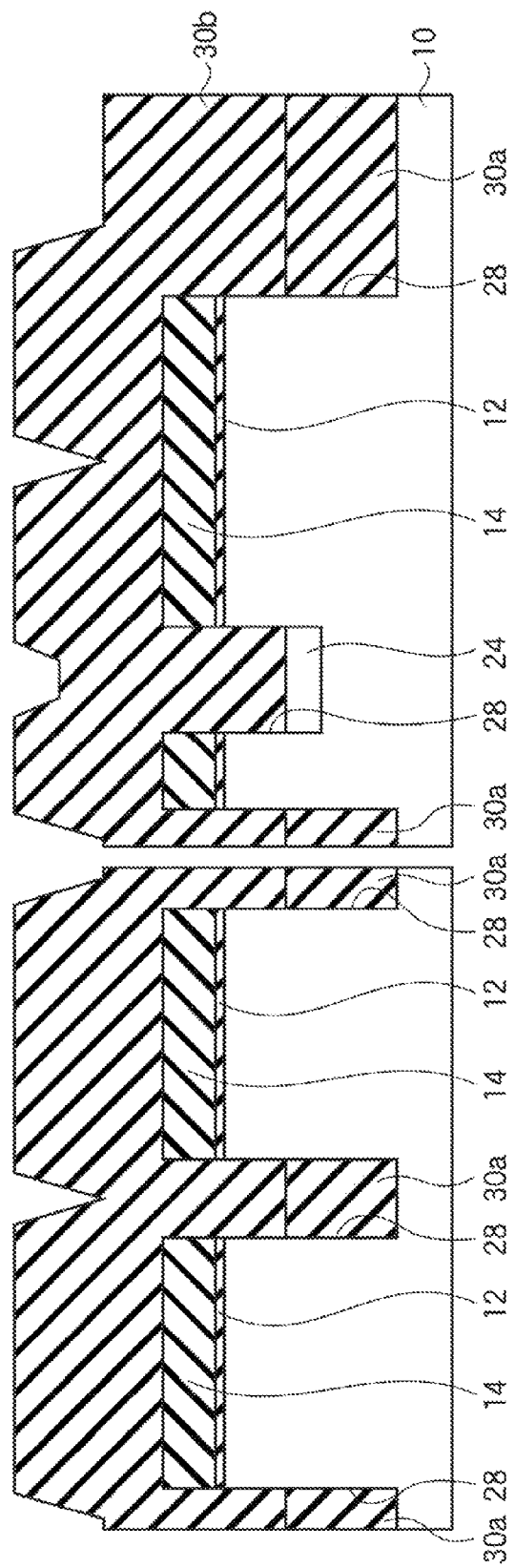

Next, by, e.g., high density plasma CVD method, the silicon oxide film 30b is deposited in a film thickness sufficient to fill the device isolation trenches 18, 28 (FIG. 27).

Hereafter, in the same way as in the method of manufacturing the semiconductor device according to the first embodiment illustrated in FIGS. 11 to 20, the semiconductor device is completed.

As described above, according to the present embodiment, in the transistor having the gate electrode and the body region connected, the impurity layer is formed in the bottom of the device isolation insulating film formed between the body region and the body contact region, whereby the body resistance can be drastically decreased. Thus, the transistor can have the speed increased and the power consumption decreased.

The impurity layer in the bottom of the device isolation insulating film is formed by ion-implanting selectively in the bottom of the device isolation trench 18 separately from the ion-implantation for forming the wells, whereby the impurity profile of the well except in the bottom of the device isolation insulating film 32 are never influenced. Accordingly, the impurity concentration of the impurity layer in the bottom of the device isolation insulating film can be suitably set corresponding to a required value of the body resistance. The impurity layer in the bottom of the device isolation insulating film is formed in the bottom of the device isolation trench in self-alignment by using the process of forming the device isolation insulating film, which never much increases the manufacturing cost.

A Third Embodiment

A semiconductor device and a method of manufacturing the same according to a third embodiment will be described with reference to FIGS. 28A to 41. The same members of the present embodiment as those of the semiconductor device and the method of manufacturing the same according to the first and the second embodiments illustrated in FIGS. 1 to 27 are represented by the same reference numbers not to repeat or to simplify their description.

Figure 28A:
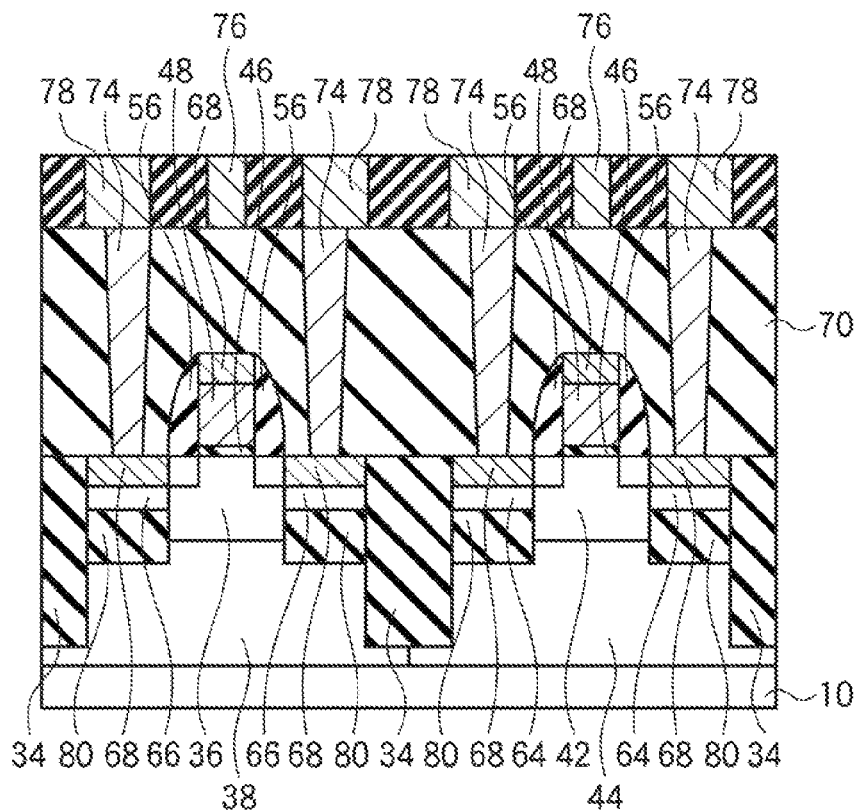
FIGS. 28A and 28B are diagrammatic sectional views illustrating a structure of a semiconductor device according to a third embodiment.
Figure 28B:
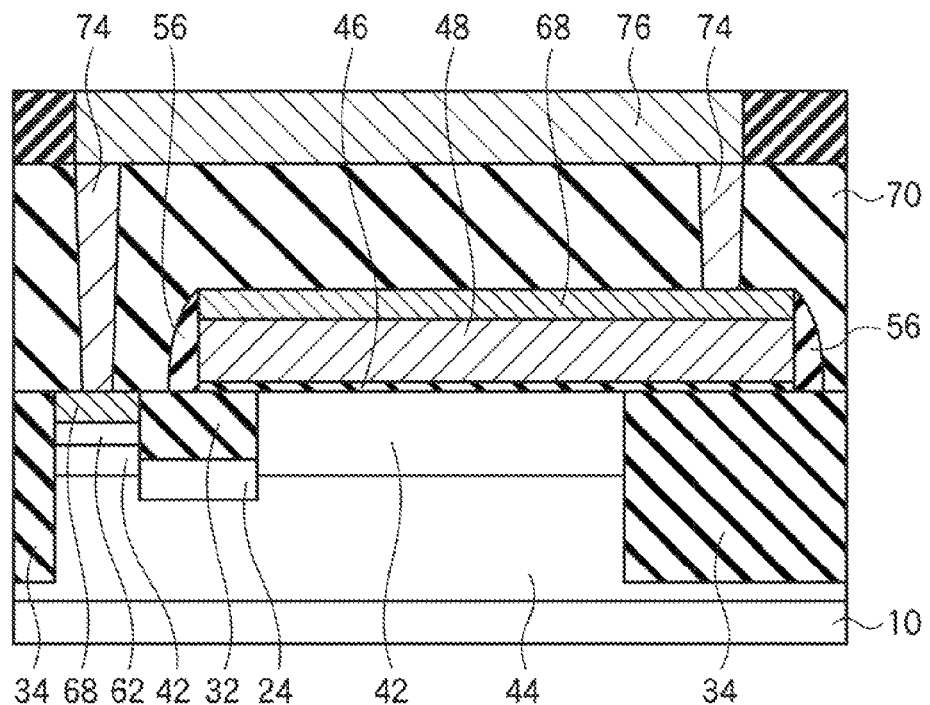

FIGS. 28A and 28B are diagrammatic sectional views illustrating a structure of the semiconductor device according to the present embodiment. FIGS. 29 to 41 are sectional views illustrating the method of manufacturing the semiconductor device according to the present embodiment.

First, the structure of the semiconductor device according to the present embodiment will be described with reference to FIG. 28. The plan views of the semiconductor device according to the present embodiment are the same as those of the semiconductor device according to the first embodiment illustrated in FIG. 1. FIG. 28A is the sectional view along A-A' line in FIG. 1, and FIG. 28B is the sectional view along C-C' line in FIG. 1.

In the silicon substrate 10, the deep device isolation insulating film 34 defining the active regions 34a where transistors are formed is formed. In the active regions 34a, the shallow device isolation insulating film 32 defining the active regions 32a, 32b in the active region 34a is formed. In FIG. 1, the right active region 34a is the n-channel transistor forming region, and the left active region 34a is the p-channel transistor forming region.

Above the active region 32a of the n-channel transistor forming region, the gate electrode 48 is formed with the gate insulating film 46 interposed therebetween. In the active region 32a on both sides of the gate electrode 48, the source/drain regions 64 are formed. Below the source/drain region 64, the buried insulating layer 80 is formed.

In the silicon substrate 10 in the n-channel transistor forming region, the p-well 42 which is deeper than the bottom of the device isolation insulating film 32 and shallower than the bottom of the buried insulating layer 80 is formed. Below the p-well 42, the n-well 44 is formed in contact with the device isolation insulating film 34. Thus, the p-well 42 formed in the n-channel transistor forming region is electrically isolated from the rest p-wells not illustrated by the n-well 44 and the device isolation insulating film 34. In the p-well 42 below the bottom of the device isolation insulating film 32, the p-type impurity layer 24 higher doped than the p-well 42 is formed.

Above the surface of the active region 32b of the n-channel transistor forming region, the p-type impurity layer 62 electrically connected to the body region below the gate electrode 48 via the p-well 42 and the p-type impurity layer 24 is formed. The p-type impurity layer 62 is the contact layer for the connection to the body region of the n-channel transistor.

Above the active region 32a of the p-channel transistor forming region, the gate electrode 48 is formed with the gate insulating film 46 interposed therebetween. In the active region 32a on both sides of the gate electrode 48, the source/drain regions 66 are formed. Below the source/drain regions 66, the buried insulating layer 80 is formed.

In the silicon substrate 10 in the p-channel transistor forming region, the n-well 36 deeper than the bottom of the device isolation insulating film 32 and shallower than the bottom of the buried insulating layer 80 is formed. Below the n-well 36, the p-well 38 is formed in contact with the device isolation insulating film 34. Thus, the n-well 36 formed in the p-channel transistor forming region is electrically isolated from the rest p-wells not illustrated by the p-well 38 and the device isolation insulating film 34. In the n-well 36 below the bottom the device isolation insulating film 32, the n-type impurity layer (not illustrated) higher doped than the n-well 36 is formed. The n-type impurity layer corresponds to the p-type impurity layer of the n-channel transistor.

Above the surface of the active region 32b in the p-channel transistor forming region, the n-type impurity layer 58 electrically connected to the body region below the gate electrode 48 via the n-well 36 and the n-type impurity layer below the n-well 36 is formed. The n-type impurity layer is the contact layer for the connection to the body region of the n-channel transistor.

The section of the p-channel transistor along the extending direction of the gate electrode 48 is the same as the C-C' line section of the n-channel transistor illustrated in FIG. 28B.

Above the gate electrodes 48 and the source/drain regions 64, 66, the metal silicide layer 68 is formed.

Above the silicon substrate 10 with the re-channel transistor and the p-channel transistor formed on, the inter-layer insulating film 70 is formed. In the inter-layer insulating film 70, the contact plugs 74 connected to the metal silicide layer 68 formed on the electrodes of the respective transistors are buried.

Above the inter-layer insulating film 70 with the contact plugs 74 buried in, the interconnection 76 for connecting the gate electrode 48 of the n-channel transistor and the p-type impurity layer 62 via the contact plug 74 is formed. The interconnection 76 for connecting the gate electrode 48 of the p-channel transistor and the n-type impurity layer 58 is formed. The interconnections 78 connected to the source/drain regions 64, 66 via the contact plugs 74 are formed.

Thus, the semiconductor device according to the present embodiment is constituted.

As described above, the semiconductor device according to the present embodiment includes the deep device isolation insulating film 34, which defines the active regions 34a of the transistor forming regions. The semiconductor device according to the present embodiment also includes in the active regions 34a the shallow device isolation insulating film 32, which defines the active region 32a to be the channel region and the source/drain regions and the active region 32b to be the body contact region connected to the body region below the channel region. In the well in the region below the device isolation insulating film 32, the impurity layer (e.g., the p-type impurity layer 24 of the n-channel transistor) of a higher concentration which is higher than the impurity concentration of the well is formed.

The active region 32a and the active region 32b are divided by the shallow device isolation insulating film 32 shallower than the well, whereby one well can be provided for one transistor while the device area is reduced. The impurity layer is formed below the device isolation insulating film 32, whereby an increase of the well resistance due to the present of the device isolation insulating film 32 can be compensated. Thus, the connection resistance between the body region and the body contact region, i.e., the body resistance can be decreased, whereby the transistor can have the speed increased and the power consumption decreased.

The semiconductor device according to the present embodiment includes the buried insulating layer 80 formed below the source/drain regions 64, 66. The buried insulating layer 80 is formed below the source/drain regions 64, 66, whereby the junction capacitance of the source/drain regions can be decreased. Thus, the transistor can have the speed more increased.

Next, the method of manufacturing the semiconductor device according to the present embodiment will be described with reference to FIGS. 29 to 41.

Figure 29:
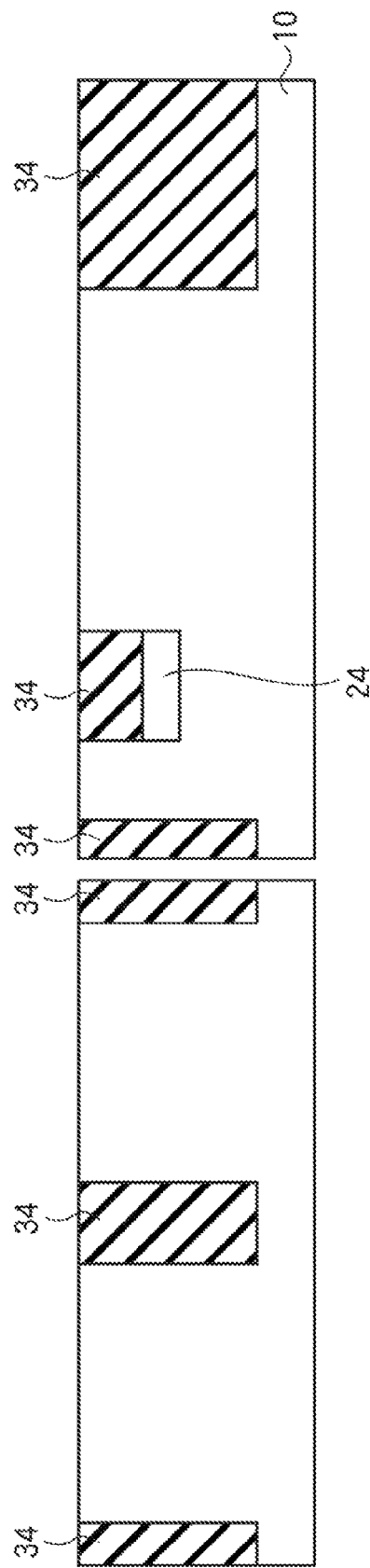
FIGS. 29 to 41 are sectional views illustrating a method of manufacturing the semiconductor device according to the third embodiment.

First, in the same way as in the method of manufacturing the semiconductor device according to the first embodiment illustrated in, e.g., FIGS. 3 to 12, the device isolation insulating films 32, 34, the n-type impurity layer 24 and the p-type impurity layer (not illustrated) formed below the device isolation insulating film 32 are formed (FIG. 29). To form the device isolation insulating films 32, 34, the method of manufacturing the semiconductor device according to the second embodiment may be also used.

Next, a silicon oxide film (not illustrated) to be the protection film in the ion implantation is formed above the surface of the silicon substrate 10 by, e.g., thermal oxidation method.

Then, a photoresist film (not illustrated) covering the n-channel transistor forming region and exposing the p-channel transistor forming region is formed by photolithography.

Then, ion implantation is made with this photoresist film as the mask to form an n-well 36 and a p-well 38. The n-well 36 is formed in the region which is deeper than the n-type impurity layer (not illustrated) below the device isolation insulating film 34 and shallower than the bottom of the device isolation insulating film 34. The p-well 38 is formed in a region deeper than the n-well 36 in contact with the device isolation insulating film 34. Thus, the n-well 36 formed in the transistor region is electrically isolated by the p-well 38 and the device isolation insulating film 34.

The n-well 36 is formed by ion-implanting, e.g., arsenic ions under the conditions, e.g., of a 20 keV-50 keV acceleration energy and a $1\times10^{12}$ cm$^{-2}$–$5\times10^{12}$ cm$^2$ dose. The p-well 38 is formed by ion-implanting, e.g., boron ions under the conditions, e.g., of a 100 keV-200 keV acceleration energy and a $7\times10^{12}$ cm$^{-2}$–$3\times10^{13}$ cm$^{-2}$ dose.

Then, the photoresist film used in forming the n-well 36 and the p-well 38 is removed by, e.g., ashing method.

Next, a photoresist film 40 covering the p-channel transistor forming region and exposing the re-channel transistor forming region is formed by photolithography.

Figure 30:
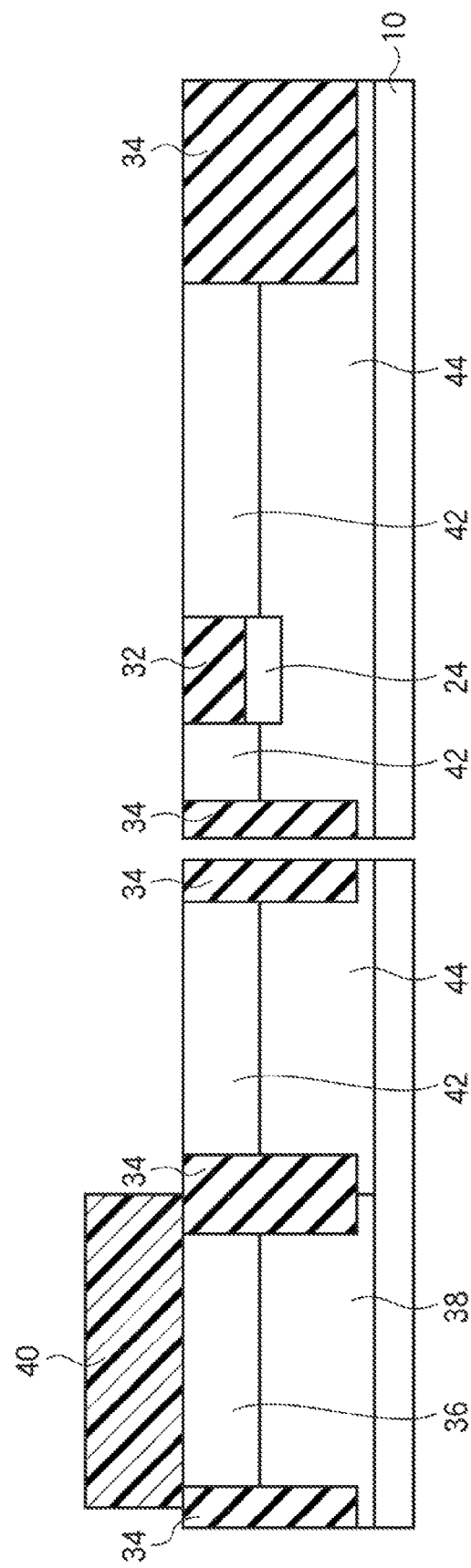

Then, ion-implantation is made with the photoresist film 40 as the mask to form a p-well 42 and an n-well 44 (FIG. 30). The p-well 42 is formed in the region deeper than the p-type impurity layer 24 below the device isolation insulating film 32 and shallower than the bottom of the device isolation insulating film 34. The n-well 44 is formed in the region deeper than the p-well 42 in contact with the device isolation insulating film 34. Thus, the p-well 42 formed in the transistor region is electrically isolated by the n-well 44 and the device isolation insulating film 34.

The p-well 42 is formed by ion-implanting, e.g., boron ions under the conditions, e.g., of a 20 keV-50 keV acceleration energy and a $5\times10^{12}$ cm$^{-2}$–$3\times10^{13}$ cm$^{-2}$ dose. the n-well 44 is formed by ion-implanting, e.g., phosphorus ions under the conditions, e.g., of a 200 keV-400 keV acceleration energy and a $7\times10^{12}$ cm$^{-2}$–$3\times10^{13}$ cm$^{-2}$ dose.

Then, the photoresist film 40 is removed by, e.g., ashing method.

Next, thermal processing is made in an inert atmosphere to active the implanted impurities. For example, rapid thermal processing of 900° C.-1100° C. and 3 seconds-10 seconds is made in nitrogen atmosphere.

Next, the silicon oxide film (not illustrated) as the protection film is removed by wet etching using, e.g., hydrofluoric acid aqueous solution.

Next, the surface of the silicon substrate 10 is thermally oxidized at a temperature of, e.g., 750° C.-1100° C. to form a gate insulating film 46 of a silicon oxide film.

Next, a polycrystalline silicon film is deposited above the gate insulating film 46, by, e.g., LPCVD method.

Then, above the polycrystalline silicon film, a silicon nitride film 82 is formed by, e.g., CVD method. The silicon nitride film 82 is to be used as the mask film mainly in the later steps of etching the silicon substrate 10 and selectively growing a silicon germanium film 88 and a silicon layer 90. The silicon nitride film 82 can be also used as the hard mask in patterning to form the gate electrodes 48. In place of the silicon nitride film 82, other materials which are usable for the same purpose may be used.

Figure 31:
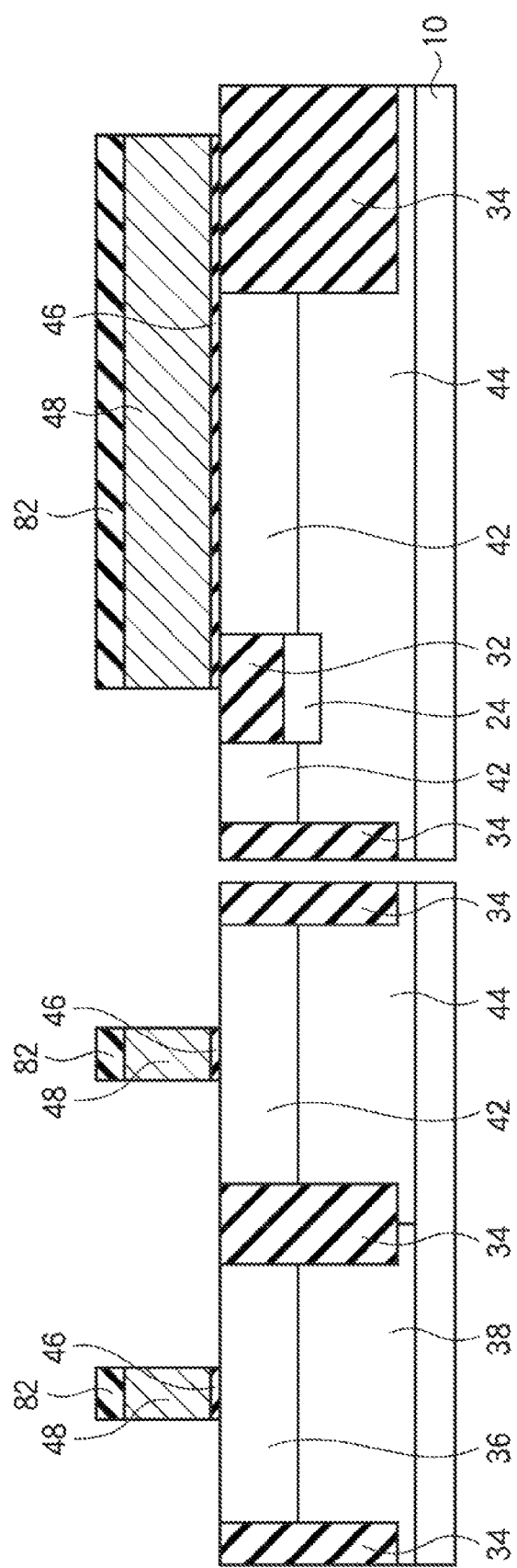

Then, by photolithography and dry etching, the silicon nitride film 82 and the polycrystalline silicon film are patterned to form gate electrodes 48 of the polycrystalline silicon film (FIG. 31).

Next, the silicon nitride film 84 is deposited above the entire surface by, e.g., CVD method. As a processing condition, for example, the temperature is 600° C.-800° C. The silicon nitride film 84 is to be used as the mask film in the later step of etching the silicon substrate 10 and selectively growing the silicon germanium layer 88 and the silicon layer 90. In place of the silicon nitride film 84, other materials which are usable for the same purpose may be used.

Next, a photoresist film (not illustrated) exposing the active region 32*a* and covering the rest region is formed by photolithography.

Next, with this photoresist film as the mask, the silicon nitride film 84 is anisotropically etched. Thus, the silicon substrate 10 in the regions where the source/drain regions 64, 66 are to be formed are exposed. On the side walls of the gate electrodes 48, the silicon nitride film 84 is left in a sidewall spacer.

Next, the photoresist film is removed by, e.g., asking method.

Figure 32:
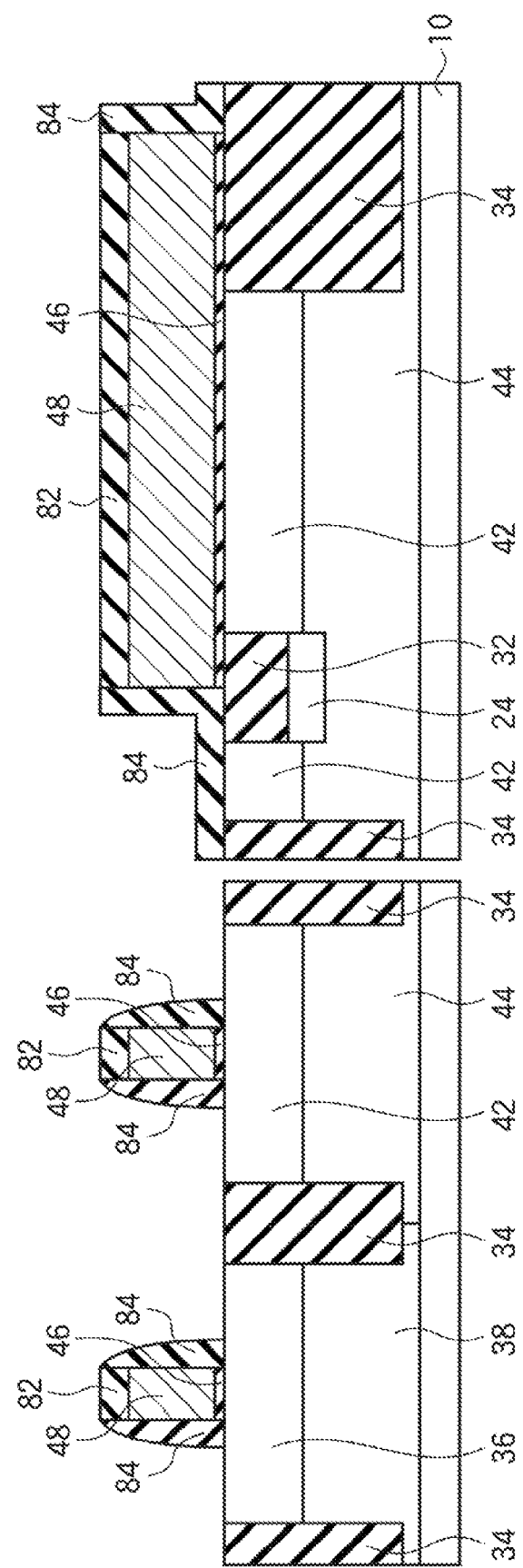

Thus, the surface of the silicon substrate 10 except in the regions where the source/drain regions 64, are to be formed, and the gate electrodes 48 are covered by the silicon nitride films 82, 84 (FIG. 32).

Figure 33:
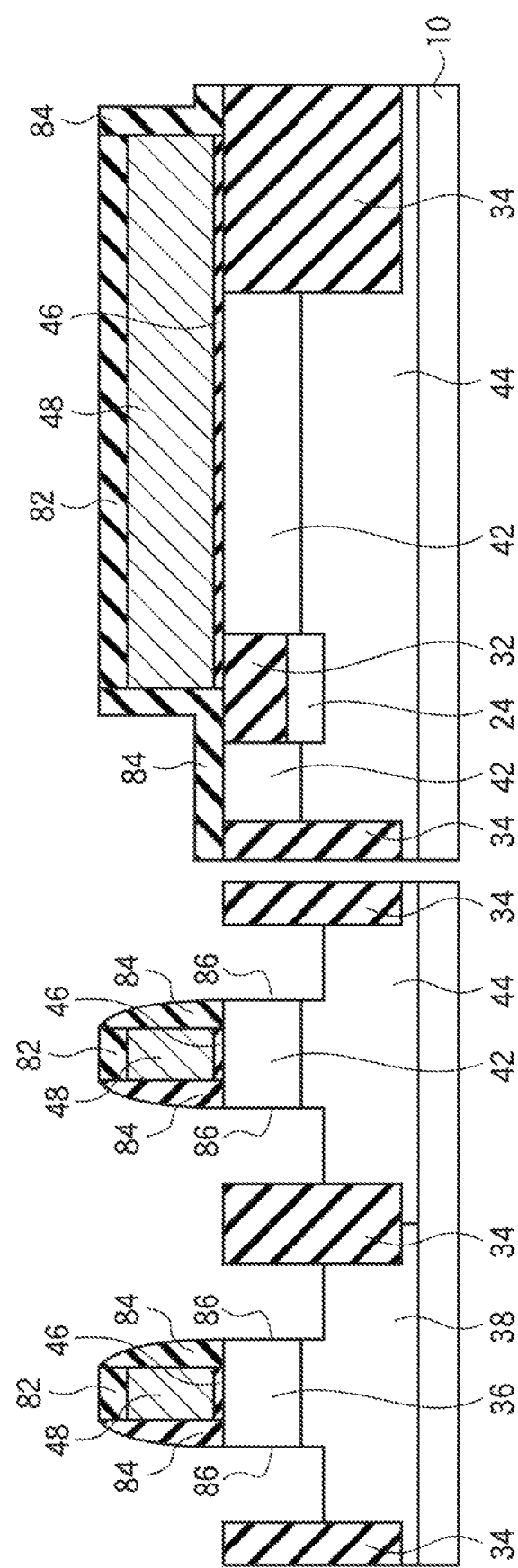
Figure 34:
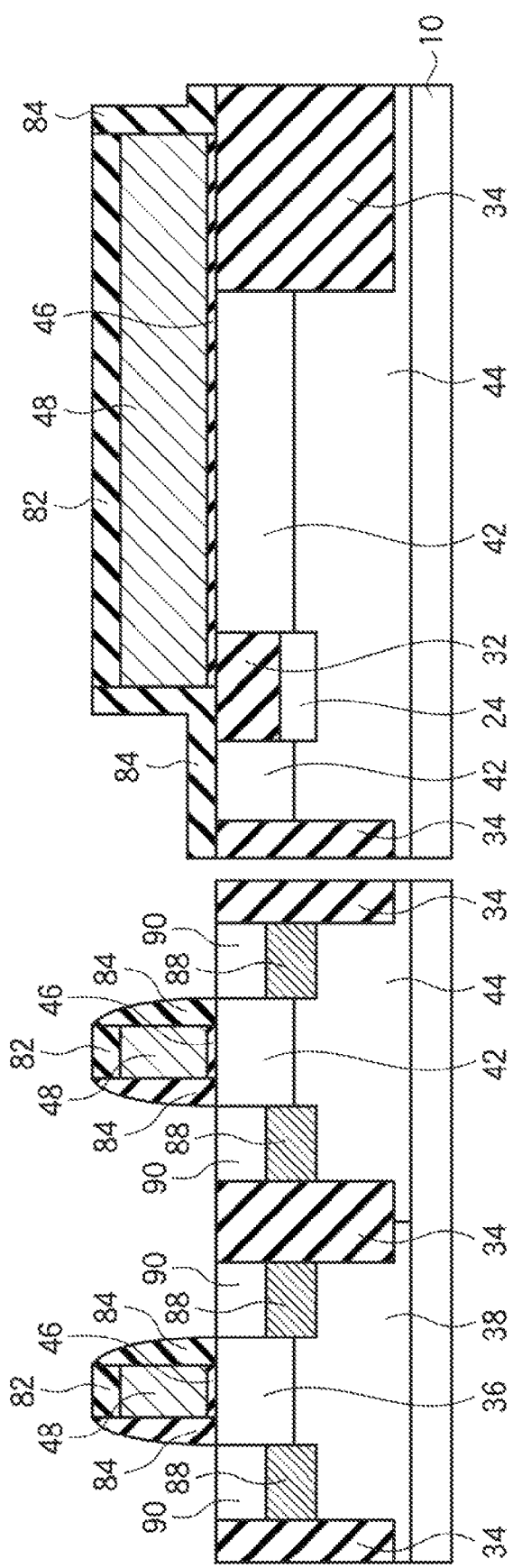

Then, the silicon substrate 10 is anisotropically etched with the silicon nitride film 82, 84 as the mask to form the trench 86 of an about 60 nm-100 nm depth in the regions where the source/drain regions 64, 66 are to be formed (FIG. 33). The bottom of the trench 86 corresponds to the bottom of the buried insulating layer 80, and the depth of the trench 86 is deeper than the depth of the p-well 42 and the n-well 36.

Next, a silicon germanium (SiGe) layer 88 of, e.g., a 30 nm-50 nm thickness and a silicon layer 90 of, e.g., a 30 nm-50 nm thickness are epitaxially grown selectively in the trench 88 with the silicon nitride film 82, 84 as the mask. A silicon concentration of the silicon germanium layer 88 is, e.g., not less than 30%. The thickness of the silicon germanium layer 88 corresponds to the thickness of a buried insulating layer 80 to be formed. Preferably, the film thickness of the silicon germanium layer 88 and the silicon layer 90 are suitably so set that the surface of the silicon substrate 10 is planarized corresponding to a required thickness of the buried insulating layer 80, a depth of the trench 86, etc. In place of the silicon germanium layer 88, another material which is epitaxially grownable on silicon and is capable of being etched selectively to silicon may be used.

Next, with the silicon nitride film 82, 84 as the mask, the device isolation insulating film 34 is etched back to expose the silicon germanium layer 88 on the side wall of the device isolation trench 28.

Figure 35:
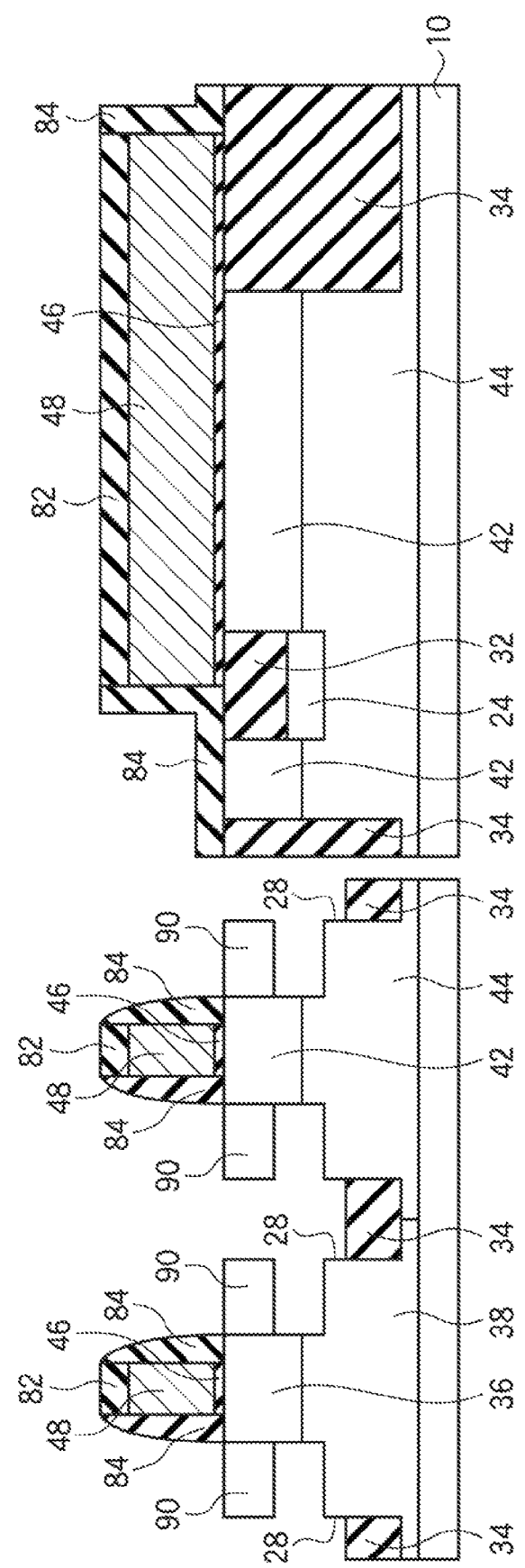

Next, the silicon germanium layer 88 is selectively etched through the device isolation trench 28 (FIG. 35).

Next, a silicon oxide film is deposited above the entire surface by, e.g., CVD method to fill back the part from which the silicon germanium layer 88 has been removed and the part from which the device isolation insulating film 34 has been removed.

Figure 36:
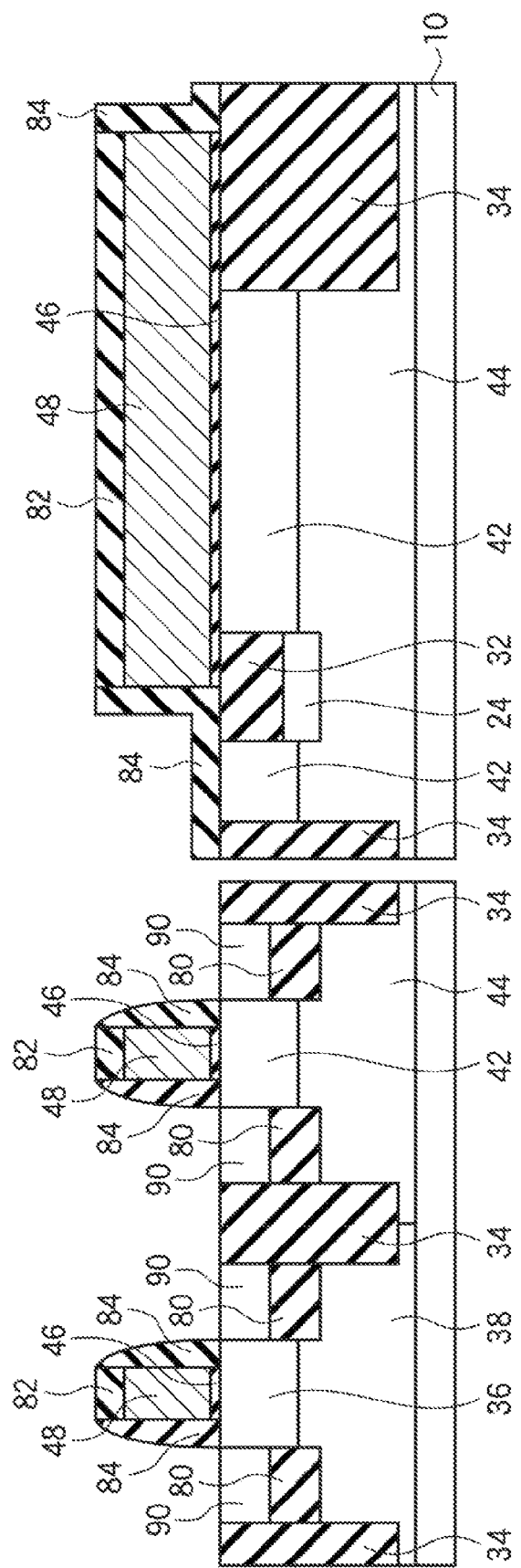

Then, the excessive silicon oxide film is etched back to form the buried insulating layer 80 and the device isolation insulating film 34 (FIG. 36).

Figure 37:
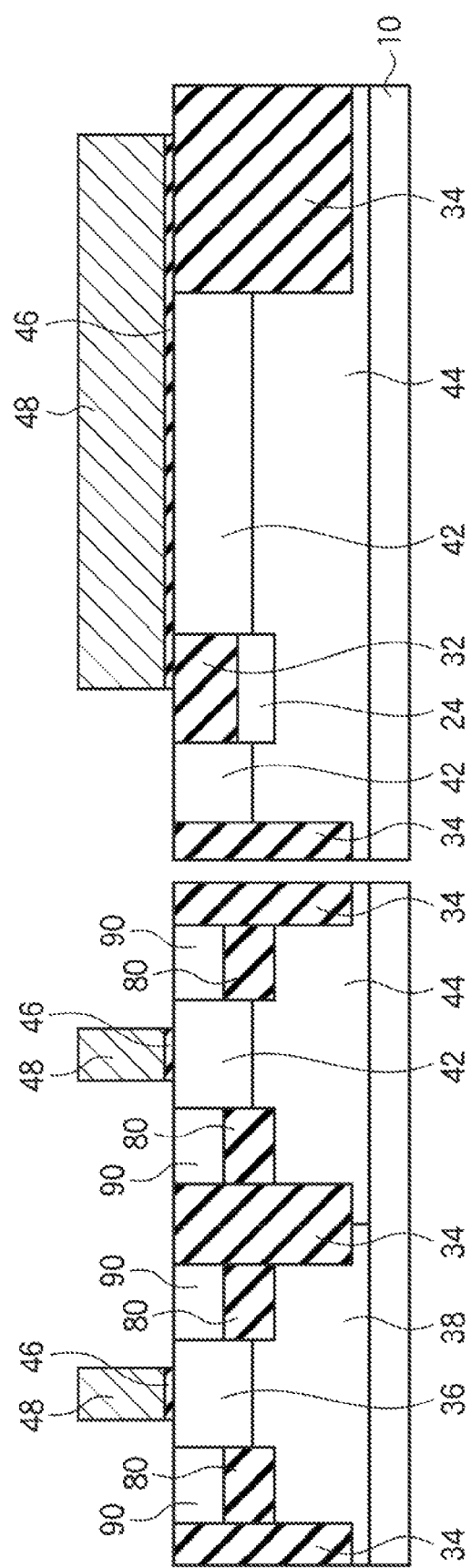
Figure 38:
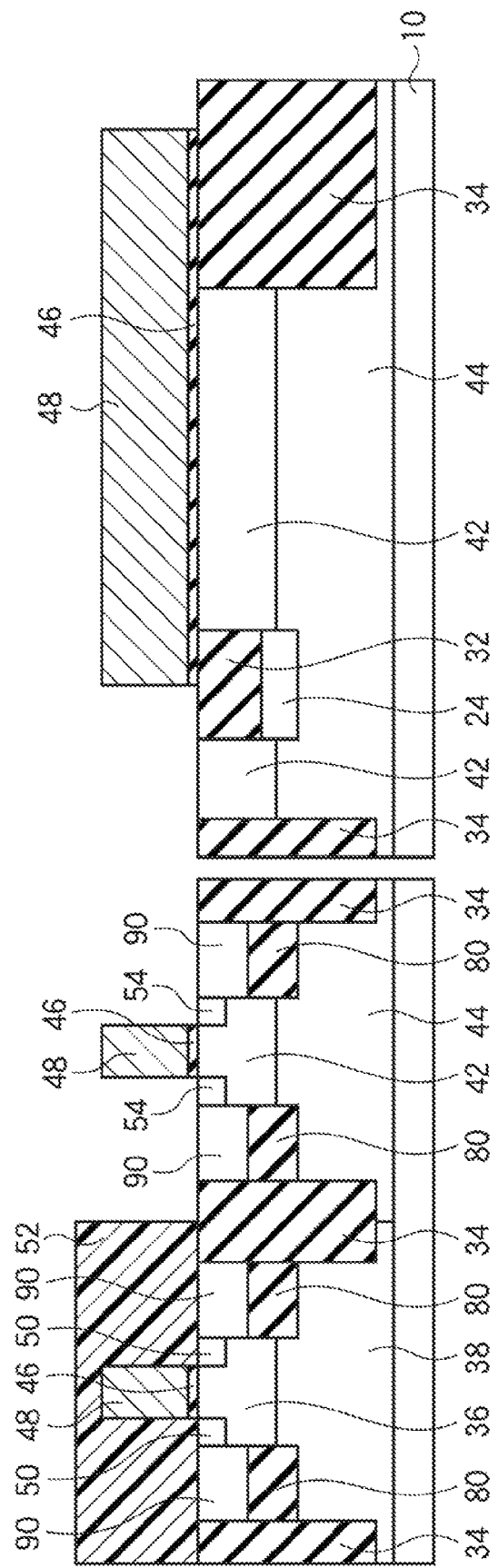

Next, the silicon nitride film 82, 84 is removed by, e.g., wet etching (FIG. 37).

Then, a photoresist film (not illustrated) covering the n-channel transistor forming region and exposing the p-channel transistor forming region is formed by photolithography.

Next, ion-implantation is made with the photoresist film and the gate electrodes 48 as the mask to form a p-type impurity layer 50 to be extension regions. As required, n-type pocket regions may be formed together with the p-type impurity layer 50.

Next, the photoresist film used in forming the p-type impurity layer 50 is removed by, e.g., asking method.

Next, a photoresist film 52 covering the p-channel transistor forming region and exposing the re-channel transistor forming region is formed by photolithography.

Then, ion-implantation is made with the photoresist film 52 and the gate electrodes 48 as the mask to form an n-type impurity layer 54 to be the extension regions (FIG. 15). As required, p-type pocket regions may be formed together with the n-type impurity layer 54.

Then, the photoresist film 52 is removed by, e.g., asking method.

Figure 39:
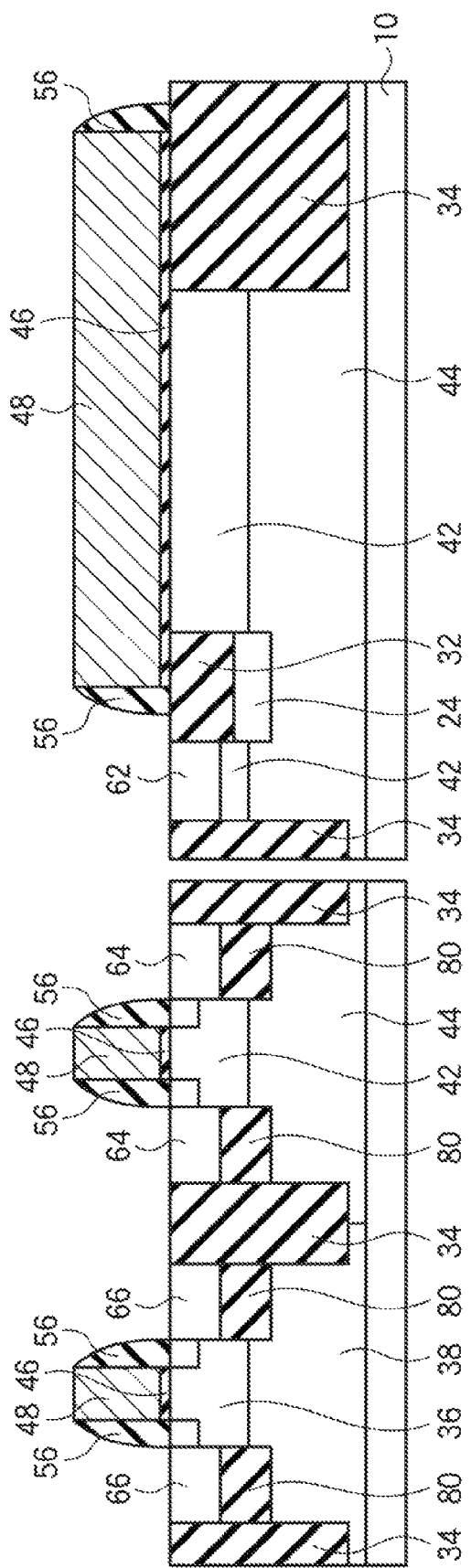

Next, in the same way as in the method of manufacturing the semiconductor device according to the first embodiment, the sidewall spacers 56 and the source/drain regions 64, 66 are formed (FIG. 39).

Then, in the same way as in the method of manufacturing the semiconductor device according to the first embodiment illustrated in FIG. 18, the metal silicide layer 68 is formed above the source/drain regions 64, 66 and above the gate electrodes 48.

Figure 40:
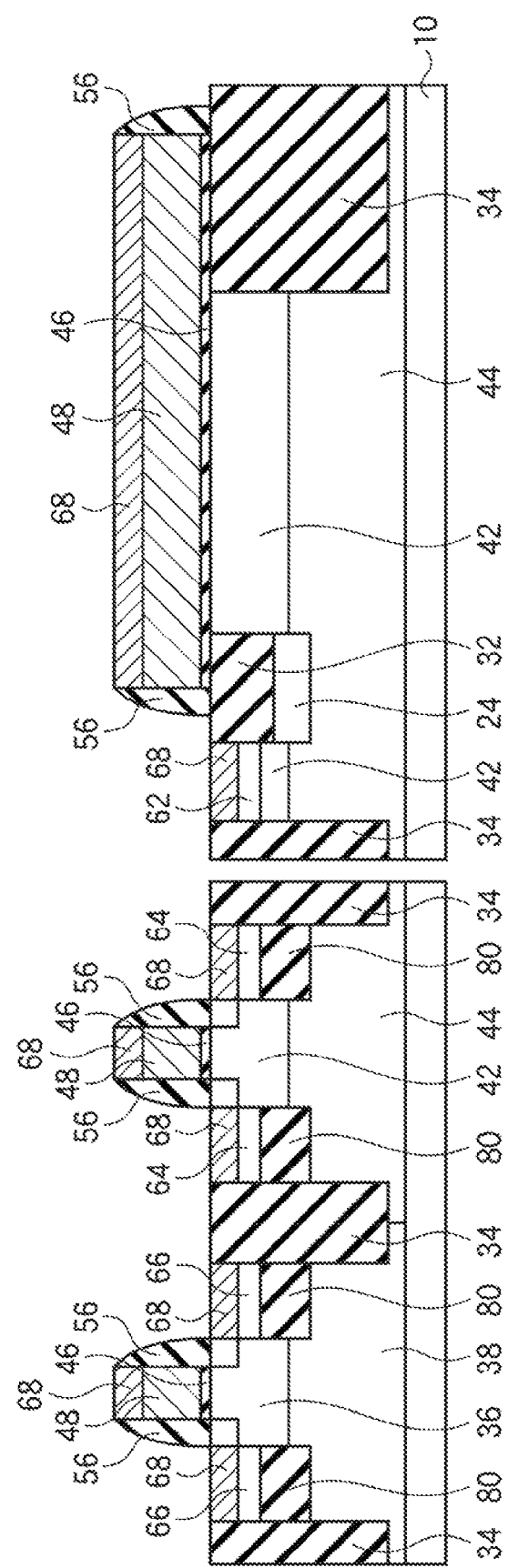

Thus, an n-channel transistor including the gate electrode 48 and the source/drain regions 64, and a p-channel transistor including the gate electrode 48 and the source/drain regions 66 are formed above the silicon substrate 10 (FIG. 40).

Figure 41:
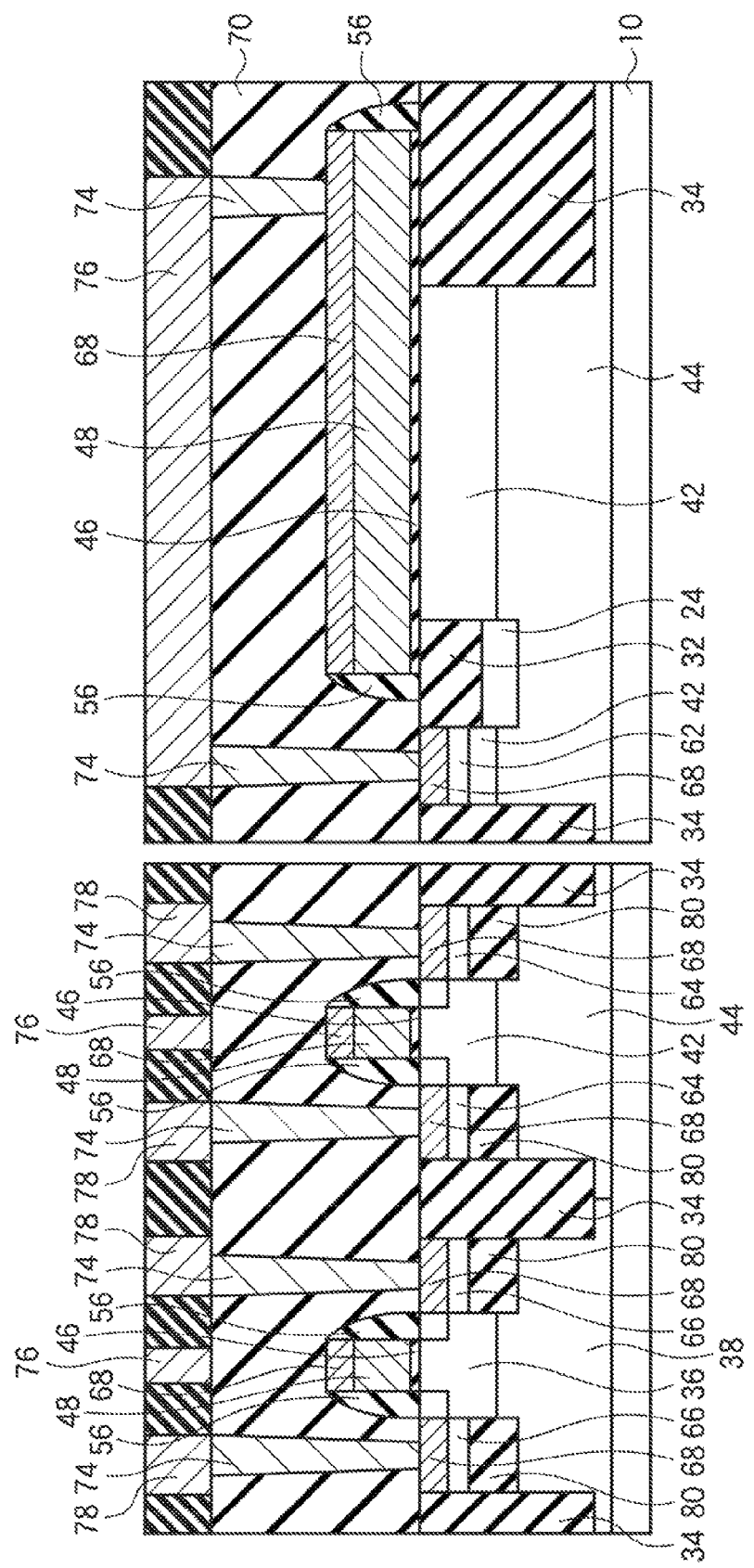

Then, in the same way as in the method of manufacturing the semiconductor device according to the first embodiment illustrated in FIGS. 19 and 20, the inter-layer insulating film 70, the contact plugs 74 and the interconnections 76, 78, etc. are formed (FIG. 41).

Hereafter, a required backend process is made, and the semiconductor device according to the present embodiment is completed.

As described above, according to the present embodiment, in the transistor having the gate electrode and the body region connected, the impurity layer is formed in the bottom of the device isolation insulating film formed between the body region and the body contact region, whereby the body resistance can be drastically decreased. Thus, the transistor can have the speed increased and the power consumption decreased.

The buried insulating film is formed between the source/drain regions and the well, whereby the junction capacitance of the source/drain regions can be decreased. Thus, the transistor can have the speed more increased.

The impurity layer in the bottom of the device isolation insulating film is formed by ion-implanting selectively in the bottom of the device isolation trench 18 separately from the ion-implantation for forming the wells, whereby the impurity profile of the well except in the bottom of the device isolation insulating film 32 are never influenced. Accordingly, the impurity concentration of the impurity layer in the bottom of the device isolation insulating film can be suitably set corresponding to a required value of the body resistance. The impurity layer in the bottom of the device isolation insulating film is formed in the bottom of the device isolation trench in self-alignment by using the process of forming the device isolation insulating film, which never much increases the manufacturing cost.

A Fourth Embodiment

A semiconductor device and a method of manufacturing the same according to a fourth embodiment will be described with reference to FIGS. 42A to 52. The same members of the present embodiment as those of the semiconductor device and the method of manufacturing the same according to the first to third embodiments illustrated in FIGS. 1 to 41 are represented by the same reference numbers not to repeat or to simplify their description.

Figure 42A:
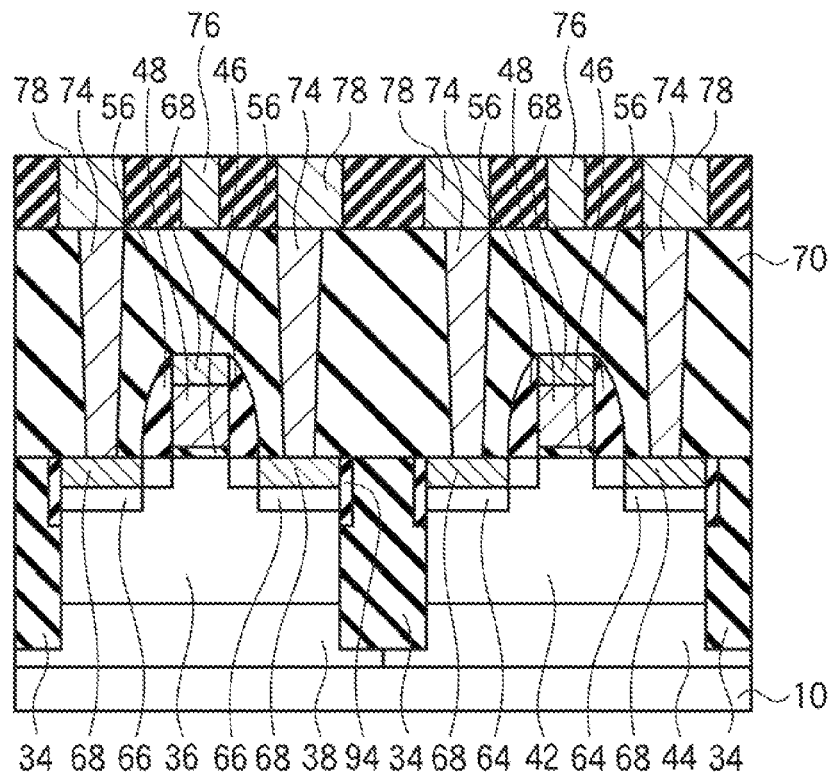
FIGS. 42A and 42B are diagrammatic sectional views illustrating a structure of a semiconductor device according to a fourth embodiment.
Figure 42B:
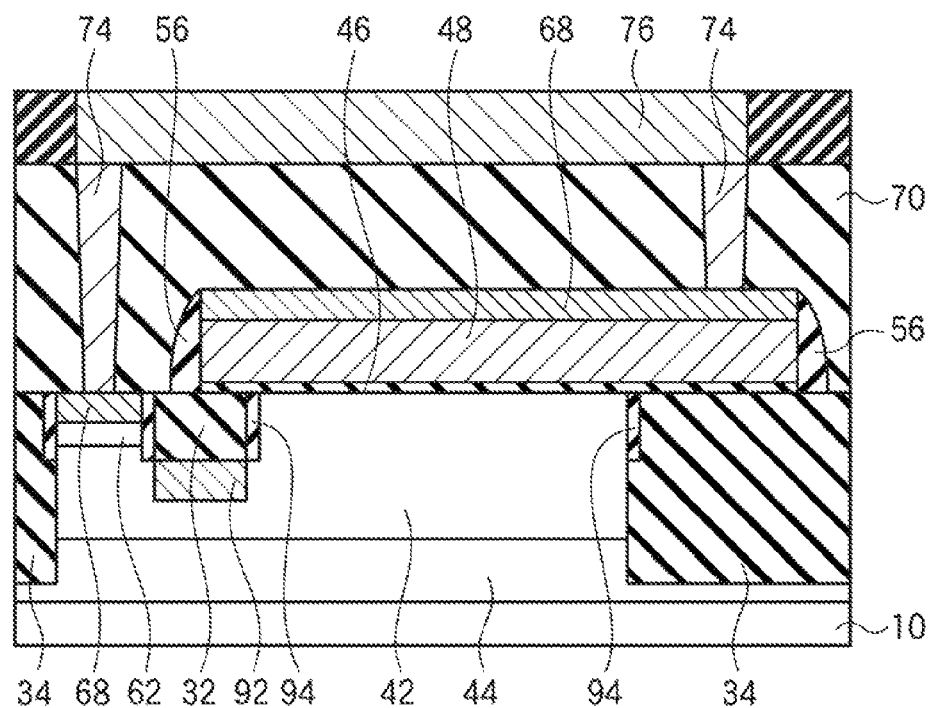

FIGS. 42A and 42B are diagrammatic sectional views illustrating a structure of the semiconductor device according to the present embodiment. FIGS. 43 to 52 are sectional views illustrating the method of manufacturing the semiconductor device according to the present embodiment.

First, the structure of the semiconductor device according to the present embodiment will be described with reference to FIGS. 42A and 42B. The plan views of the semiconductor device according to the present embodiment are the same as those of the semiconductor device according to the first embodiment illustrated in FIG. 1. FIG. 42A is the sectional view along A-A' line in FIG. 1, and FIG. 42B is the sectional view along C-C' line in FIG. 1.

As illustrated in FIGS. 42A and 42B, the semiconductor device according to the present embodiment is the same as the semiconductor device according to the first embodiment illustrated in FIGS. 2A and 2B except that a metal silicide layer 92 in place of the n-type impurity layer 24 or the p-type impurity layer 20 is formed above the bottom of the shallow device isolation insulating film 32.

By forming the metal silicide layer 92 below the device isolation insulating film 32 as well, the electric resistance of the region below the device isolation insulating film 32 can be made lower than the electric resistance of the other region of the well on the same depth level. That is, by the metal silicide layer 92 below the device isolation insulating film 32, an increase of the well resistance between the active region 32a and the active region 32b due to forming the device isolation insulating film 32 can be compensated. Thus, the connection resistance between the body region and the body contact region, i.e., the body resistance can be decreased. The transistor can have the speed increased and the power consumption decreased.

Next, the method of manufacturing the semiconductor device according to the present embodiment will be described with reference to FIGS. 43 to 52.

Figure 43:
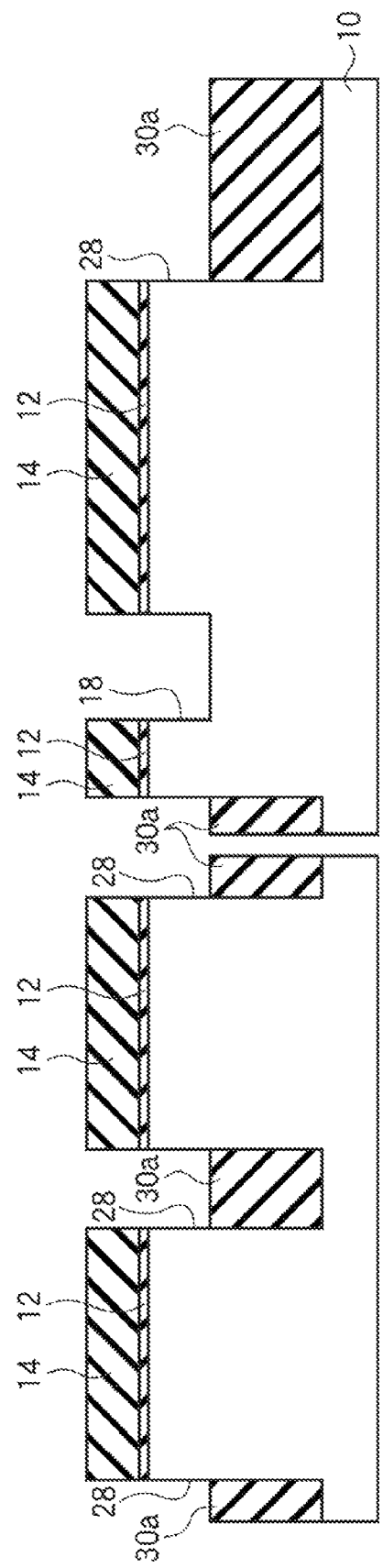
FIGS. 43 to 52 are sectional views illustrating a method of manufacturing the semiconductor device according to the fourth embodiment.

First, in the same way as in the method of manufacturing the semiconductor device according to, e.g., the second embodiment, the device isolation trenches 18, 28 are formed, and then the silicon oxide film 30a is buried (FIG. 43).

Figure 44:
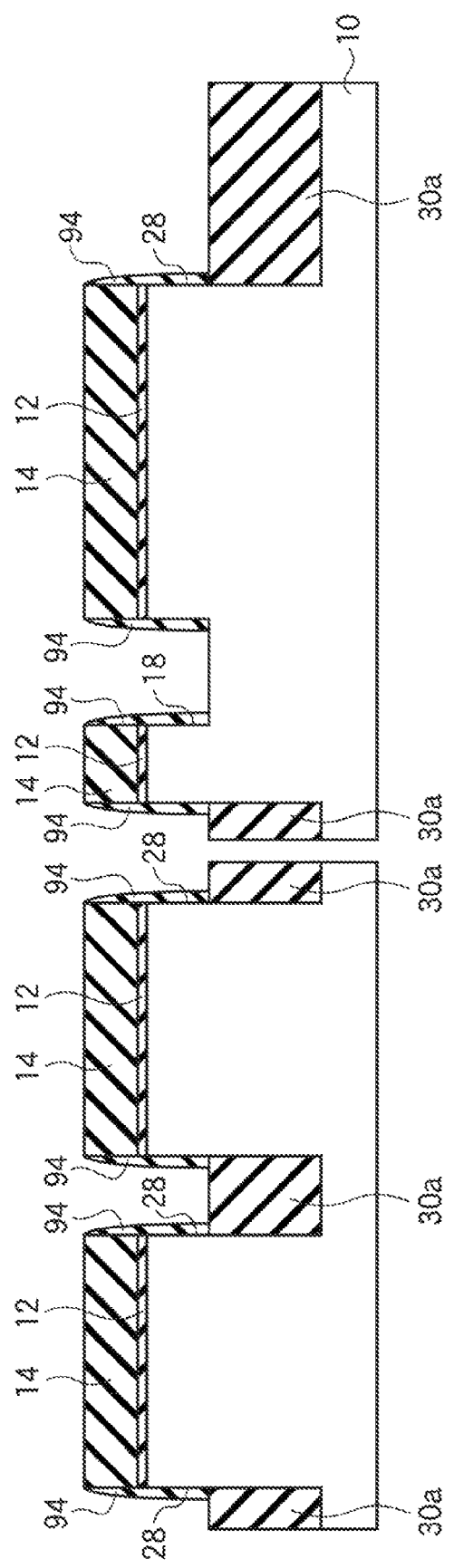

Then, a silicon nitride film is deposited by, e.g., CVD method and then etched back to form the sidewall spacers 94 of the silicon nitride film on the side walls of the silicon nitride film 14, the silicon oxide film 12 and the device isolation trenches 18, 28 (FIG. 44). Thus, the surface of the silicon substrate 10 except the bottom of the device isolation trench 18 is covered by the silicon oxide film 30a or the silicon nitride film 94.

Figure 45:
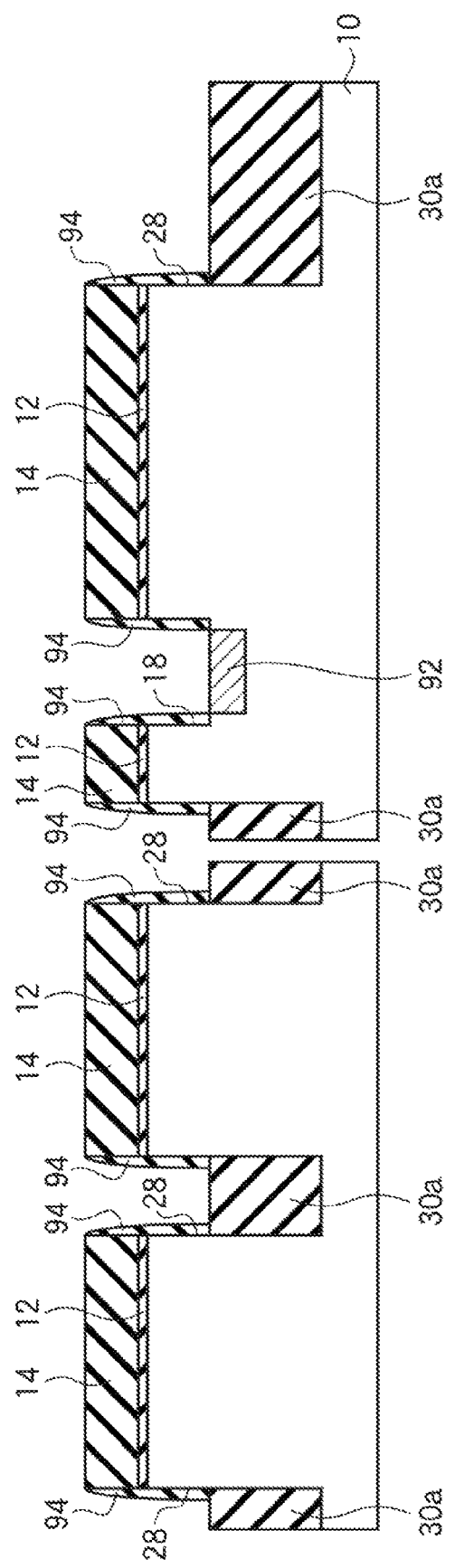

Then, the metal silicide film 92 is formed selectively on the bottom of the device isolation trench 18 by salicide process (FIG. 45). As the metal material for forming the metal silicide layer 92, for example, tungsten (W), platinum (Pt), titanium (Ti), cobalt or others may be used. It is preferable that the metal silicide layer 92, which is formed before the activation thermal processing for the source/drain regions 64, 66, etc., is formed of the silicide material of the above-described metal, whose heat resistance is high.

For example, tungsten silicide ($WSi_2$) has an about 2160° C. melting point, and the heat resistance of about 1400° C. has been confirmed empirically in the diffusion prevention. Platinum silicide (PtSi) has an about 1229° C. melting point, and the heat resistance of about 800° C. has been confirmed empirically in the diffusion prevention. Titanium silicide ($TiSi_2$) has an about 1326° C. melting point, and the heat resistance of about 900° C. has been confirmed empirically in the diffusion prevention.

The impurity layer may be formed in the same way as in the second embodiment before the metal silicide layer 92 is formed or after the metal silicide layer 92 has been formed. The presence of the impurity layer formed in the bottom of the device isolation trench 18 can decrease the contact resistance between the metal silicide layer 92 and the silicon substrate 10. The impurity layer formed in the bottom of the device isolation trench 18 may not essentially differently doped between the n-channel transistor forming region and the p-channel transistor forming region.

Figure 46:
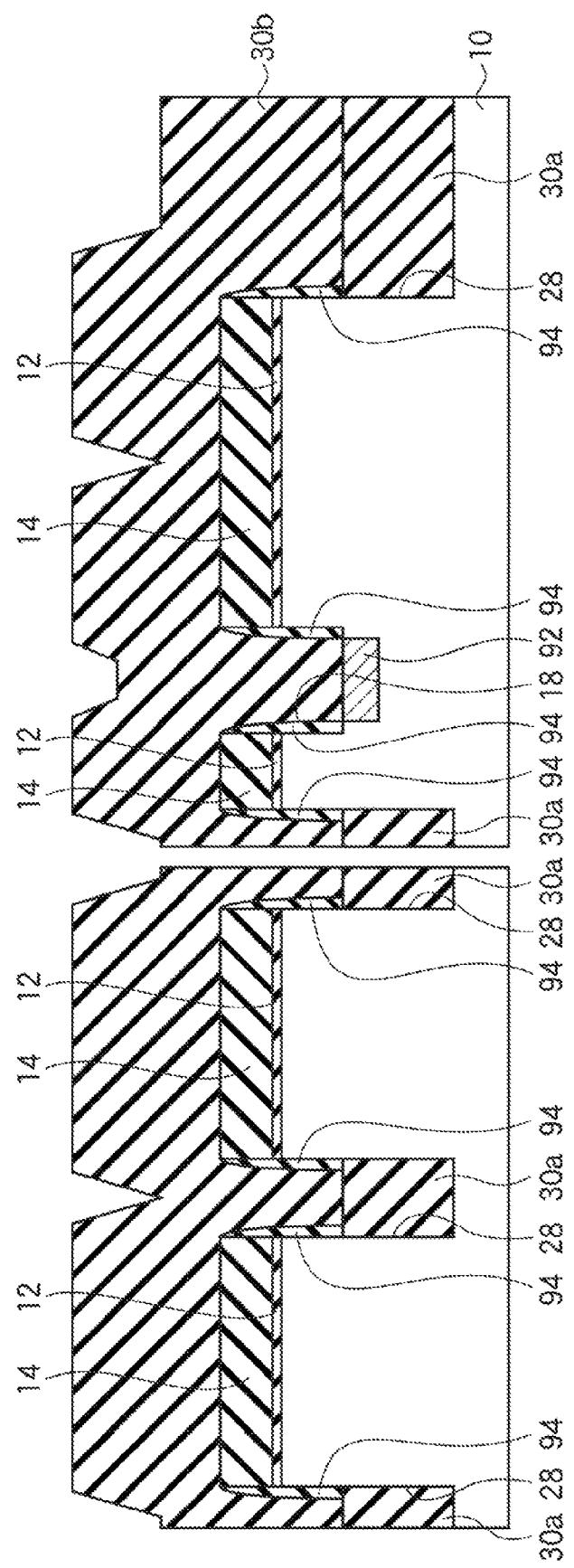

Next, the silicon oxide film 30b of a sufficient film thickness to fill the device isolation trenches 18, 28 is formed above the entire surface by, e.g., high density plasma CVD method (FIG. 46).

Figure 47:
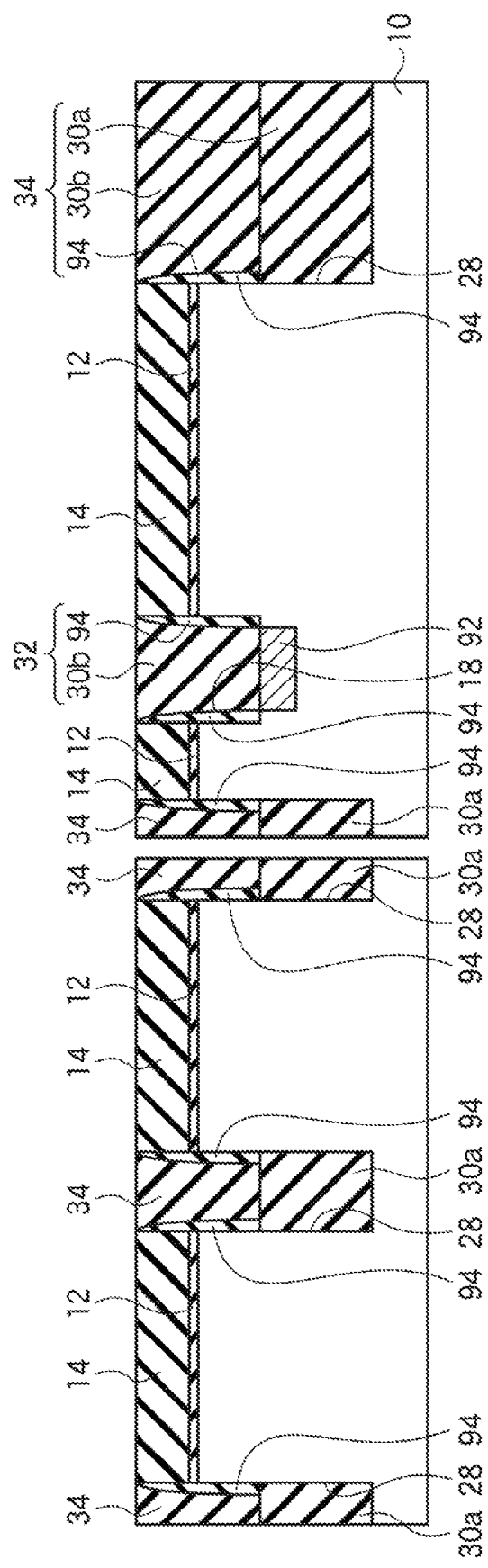

Then, the silicon oxide film 30b above the silicon nitride film 14 is removed by, e.g., CMP method. Thus, the device isolation insulating film 32 formed of the silicon oxide film 30a and the sidewall spacers 94 buried in the device isolation trench 18, and the device isolation insulating film 34 formed of the silicon oxide film 30a, 30b and the sidewall spacers 94 buried in the device isolation trench 28 is formed (FIG. 47).

Next, the surface of the device isolation insulating film 32, 34 is etched by a prescribed quantity by wet etching using, e.g., hydrofluoric acid aqueous solution. This etching is for adjusting the height of the surface of the active regions and the height of the surface of the device isolation insulating films 32, 34 to be on substantially the same level.

Next, the silicon nitride film 14 is removed by wet etching using, e.g., boiled phosphoric acid.

Figure 48:
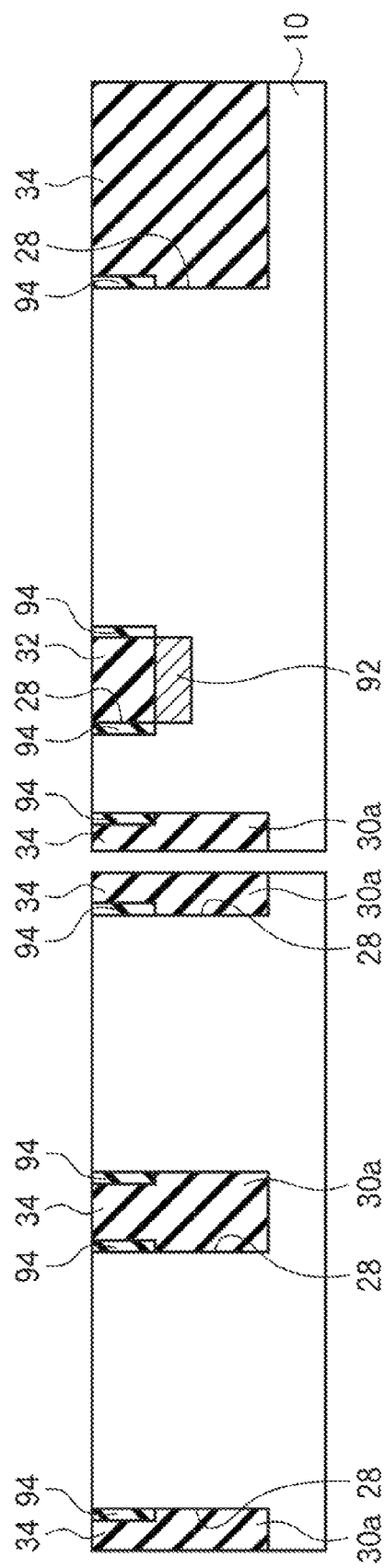

Then, the silicon oxide film 12 is removed by wet etching using, e.g., hydrofluoric acid aqueous solution (FIG. 48).

Figure 49:
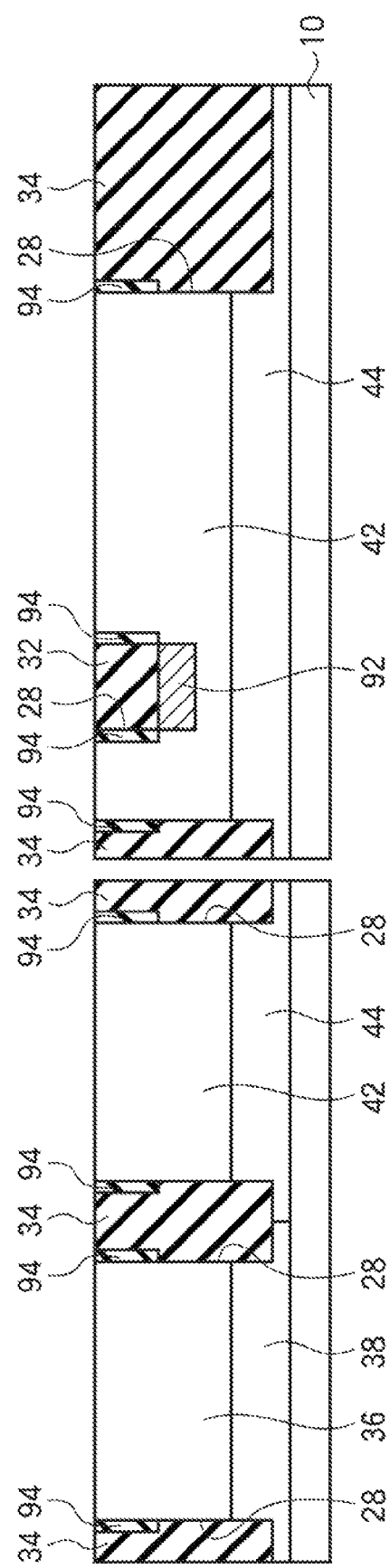

Next, in the same way as in the method of manufacturing the semiconductor device according to the first embodiment illustrated in FIG. 13, the n-well 36 and the p-well 38 are formed in the p-channel transistor forming region, and in the n-channel transistor forming region, the p-well 42 and the n-well 44 are formed (FIG. 49).

To activate the wells, rapid thermal processing of, e.g., 900° C.-1100° C. and 3 seconds-10 seconds is made in, e.g., nitrogen atmosphere. Preferably, the thermal processing conditions are selected suitably in consideration of the heat resistance temperature of the metal silicide layer 92.

Figure 50:
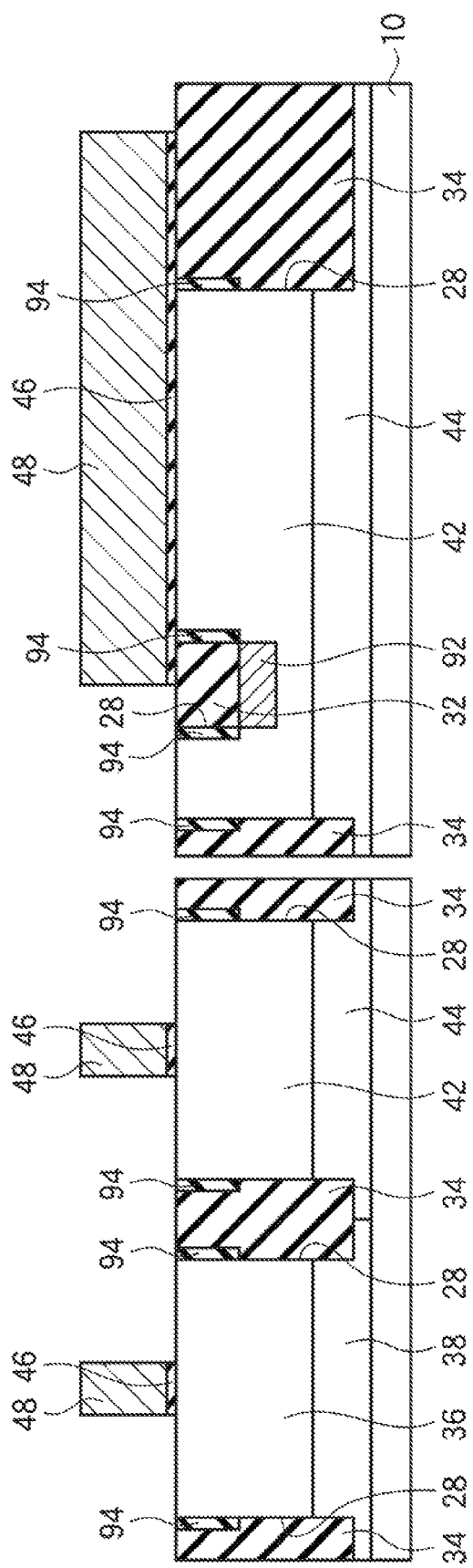

Next, in the same way as in the method of manufacturing the semiconductor device according to the first embodiment illustrated in FIG. 14, the gate insulating film 46 and the gate electrodes 48 are formed (FIG. 50).

Figure 51:
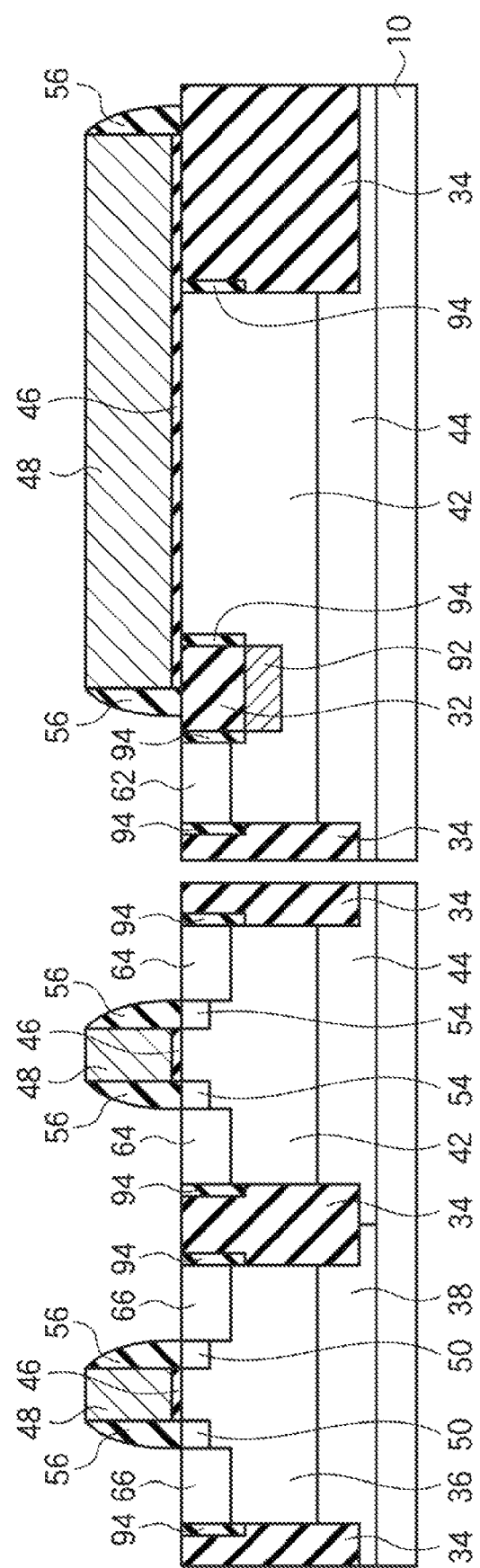

Next, in the same way as in the method of manufacturing the semiconductor device according to the first embodiment illustrated in FIGS. 15 to 17, the sidewall spacers 56 and the source/drain regions 64, 66 are formed (FIG. 51).

To activate the source/drain regions 64, 66, spike anneal of, e.g., 900° C.-1100° C. is made in, e.g., nitrogen atmosphere.

Preferably, the thermal processing conditions are selected suitably in consideration of the heat resistance temperature of the metal silicide layer 92.

Figure 52:
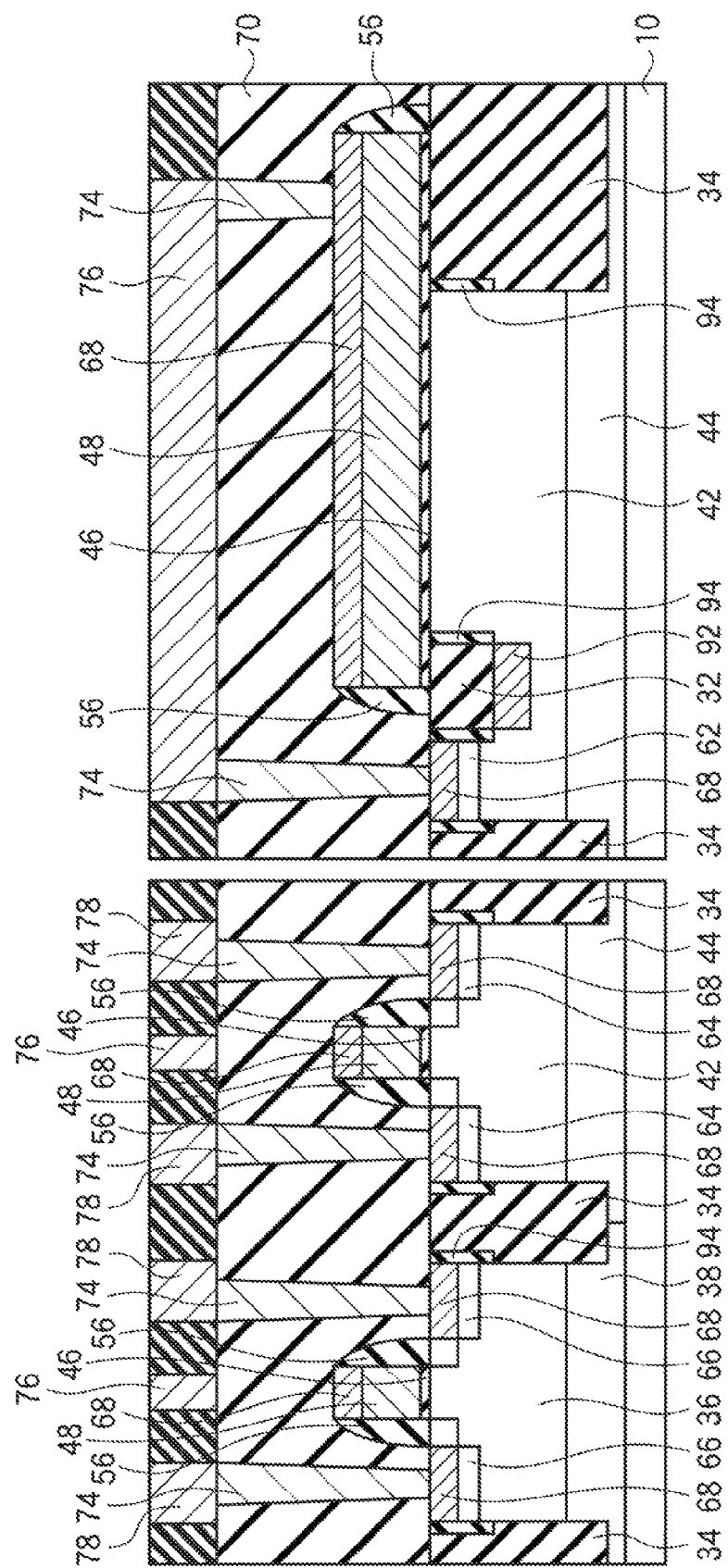

Next, in the same way as in the method of manufacturing the semiconductor device according to the first embodiment illustrated in FIGS. 18 to 20, the metal silicide layer 68, the inter-layer insulating film 70, the contact plugs 74, the interconnections 76, 78, etc. are formed (FIG. 52).

Hereafter, a required backend process is made, and the semiconductor device according to the present embodiment is completed.

As described above, according to the present embodiment, the transistor having the gate electrode and the body region connected, the metal silicide layer is formed on the bottom of the device isolation insulating region, whereby the body resistance can be drastically decreased. Thus, the transistor can have the speed increased and the power consumption decreased.

The metal silicide layer on the bottom of the device isolation insulating film is formed on the bottom of the device isolation insulation trench in self-alignment by using the process of forming the device isolation insulating film, which does not much increase the manufacturing cost.

A Fifth Embodiment

A method of manufacturing a semiconductor device according to a fifth embodiment will be described with reference to FIGS. 53 and 54. The same members of the present embodiment as those of the semiconductor device and the method for manufacturing the semiconductor device according to the first to the fourth embodiment illustrated in FIGS. 1 to 52 are represented by the same reference numbers not to repeat or to simplify their description.

Figure 53:
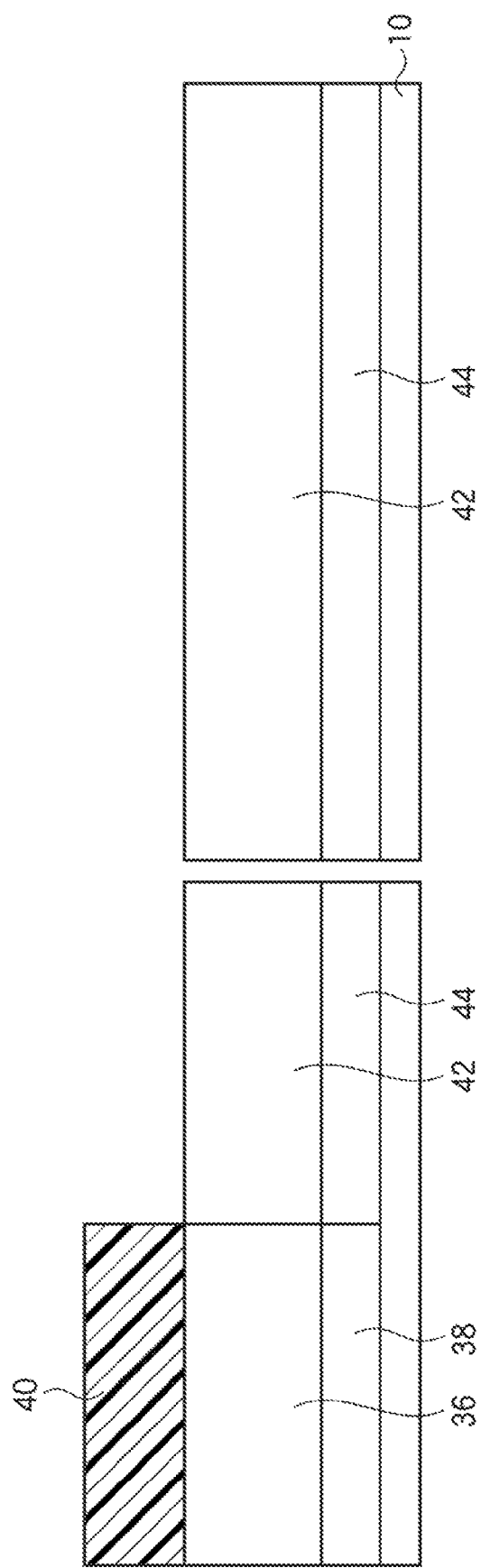
FIGS. 53 and 54 are sectional views illustrating a method of manufacturing a semiconductor device according to a fifth embodiment.
Figure 54:
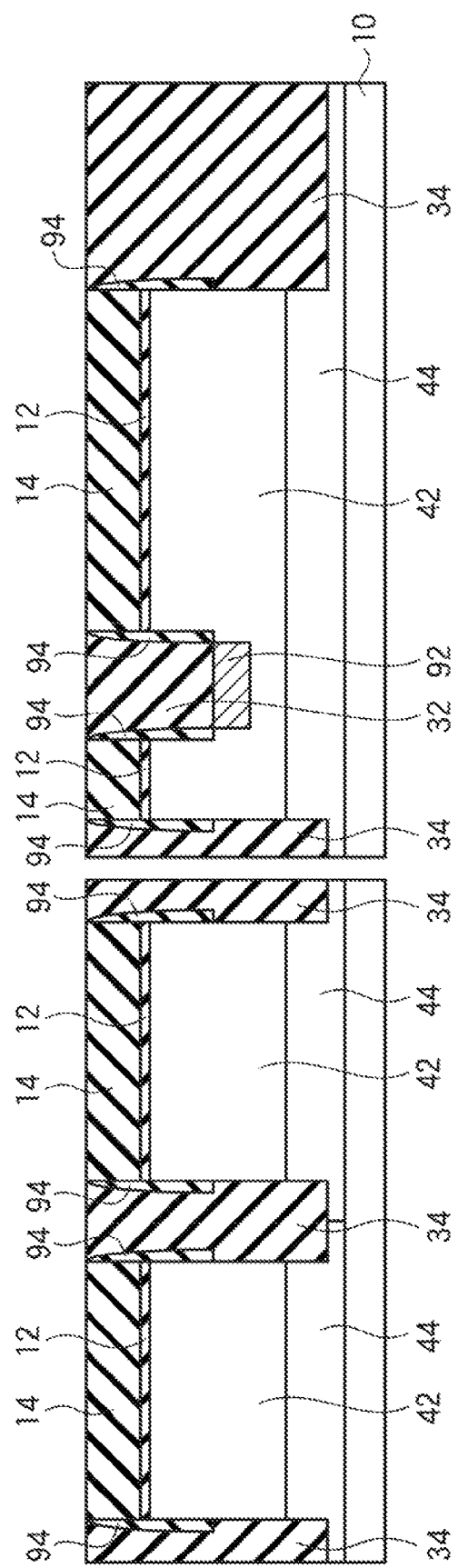

FIGS. 53 and 54 are sectional views illustrating the method of manufacturing the semiconductor device according to the present embodiment.

In the present embodiment, another method of manufacturing the semiconductor device according to the fourth embodiment illustrated in FIGS. 42A and 42B will be described. The method of manufacturing the semiconductor device according to the present embodiment is the same as the method of manufacturing the semiconductor device according to the fourth embodiment except that in the former the step of forming the wells and the step of forming the device isolation insulating film are reverse.

First, a silicon oxide film (not illustrated) to be the protection film in the ion-implantation is formed above the surface of the silicon substrate 10 by, e.g., thermal oxidation method.

Next, a photoresist film (not illustrated) covering the n-channel transistor forming region and exposing the p-channel transistor forming region is formed by photolithography.

Next, ion-implantation is made with this photoresist film as the mask to form the n-well 36 and the p-well 38 in the p-channel transistor forming region.

Then, the photoresist film used in forming the n-well 36 and the p-well 38 is removed by, e.g., asking method.

Next, a photoresist film 40 covering the p-channel transistor forming region and exposing the re-channel transistor forming region is formed by photolithography.

Next, ion-implantation is made with the photoresist film 40 as the mask to form the p-well 42 and the n-well 44 (FIG. 53).

Next, the photoresist film 40 is removed by, e.g., asking method.

Then, thermal processing is made in an inert atmosphere to activate the implanted impurities. For example, rapid thermal processing of, e.g., 900° C.-1100° C. and 3 seconds-10 seconds is made in, e.g. nitrogen atmosphere.

Next, in the same way as in the method of manufacturing the semiconductor device according to the fourth embodiment, the metal silicide layer 92 and the device isolation insulating films 32, 34 are formed on the silicon substrate 10 with the n-wells 36, 44 and the p-wells 38, 42 formed in (FIG. 54).

Thus, in the present embodiment wherein the n-wells 36, 44 and the p-wells 38, 42 has been formed before the metal silicide layer 92 is formed, the metal silicide layer 92 is prevented from being exposed to the thermal processing for the activation of the wells. Thus, the steps of thermal processing the metal silicide layer 92 can be decreased, and resultantly the diffusion of the metal from the metal silicide layer 92, etc. can be prevented. Thus, the degradation of the transistor characteristics, etc. due to the metal can be prevented.

Hereafter, in the same way as in the method of manufacturing the semiconductor device according to the fourth embodiment illustrated in FIGS. 48 to 52, the semiconductor device is completed.

As described above, according to the present embodiment, the transistor having the gate electrode and the body region connected, the metal silicide layer is formed on the bottom of the device isolation insulating region, whereby the body resistance can be drastically decreased. Thus, the transistor can have the speed increased and the power consumption decreased.

The metal silicide layer on the bottom of the device isolation insulating film is formed on the bottom of the device isolation insulation trench in self-alignment by using the process of forming the device isolation insulating film, which does not much increase the manufacturing cost. The wells are formed before the device isolation insulating film is formed, whereby the steps of thermal processing the metal silicide layer can be decreased, whereby the degradation of the transistor characteristics due to the metal contamination, etc. can be suppressed.

Modified Embodiments

The above-described embodiment can cover other various modifications.

For example, in the above-described embodiments, the bulk silicon substrate 10 is used as the substrate, but in place of the bulk silicon substrate 10, an SOI substrate may be used. In this case, the shallow device isolation insulating film 32 which does not arrive at the buried insulating layer of the SOI substrate, and the deep device isolation insulating film 34 which arrives at the buried insulating layer of the SOI substrate are formed. The buried insulating layer of the SOI substrate is used in place of the wells (p-well 38 and the n-well 44) outside the double well, whereby the n-well 36 and the p-well 42 can be isolated from the other wells.

In the first to the third embodiments, the wells are formed after the device isolation insulating film 32, 34 has been formed, but as in the fifth embodiment, the device isolation insulating film 32, 34 may be formed after the wells have been formed.

In the above-described embodiments, the impurity layer is formed in the bottom of the device isolation insulating film 32, but as in the fourth embodiment, the metal silicide layer 92 may be formed in place of the impurity layer.

In the above-described embodiments, to form a plurality of transistors on one semiconductor substrate, the respective transistor forming regions are isolated from each other. However, in the case that a plurality of transistors are not formed, it is not essential to form the structure for isolating the respectively transistors from each other. For example, the wells may not have the double well structure, and the device isolation insulating film which is deeper than the wells may not be provided.

The structure, the constituent materials, the manufacturing conditions, etc. of the semiconductor device described in the above-described embodiments are one example and can be suitably modified or changed in accordance with the technical common sense of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first device isolation insulating film formed in a semiconductor substrate;
   a first well having a first conductivity type, defined by the first device isolation insulating film, and shallower than the first device isolation insulating film;
   a second device isolation insulating film formed in the first well, shallower than the first well, and defining a first part of the first well and a second part of the first well;
   a gate insulating film formed above the first part;
   a gate electrode formed above the gate insulating film; and
   an interconnection electrically connected to the second part of the first well and the gate electrode, wherein
   an electric resistance of the first well in a first region below the second device isolation insulating film is lower than an electric resistance of the first well in a second region other than the first region on the same depth level.

2. The semiconductor device according to claim 1, further comprising:
   an impurity layer having the first conductivity type, formed in the first region below the second device isolation insulating film, and having an impurity concentration higher than an impurity concentration of the first well in the second region on the same depth level.

3. The semiconductor device according to claim 2, wherein a bottom of the impurity layer is positioned deeper than a bottom of the first well.

4. The semiconductor device according to claim 1, further comprising:
   a metal silicide layer formed in the first region below the second device isolation insulating film.

5. The semiconductor device according to claim 1, further comprising:
   a source/drain region formed in the first part; and
   a buried insulating layer formed between a bottom of the source/drain region and the first well.

6. The semiconductor device according to claim 1, further comprising
   a second well having a second conductivity type, formed on a bottom of the first well in contact with the first device isolation insulating film.

7. A method of manufacturing a semiconductor device comprising:
   forming in a semiconductor substrate a first device isolation trench and a second device isolation trench shallower than the first device isolation trench, the first device isolation trench defining a first region, the second device isolation trench defining a first part and a second part in the first region;
   forming an impurity layer of a first conductivity type in a bottom of the second device isolation trench;
   forming a first insulating film above the semiconductor substrate with the first device isolation trench and the second device isolation trench formed in;
   planarizing the first insulating film to form a first device isolation insulating film buried in the first device isolation trench and a second device isolation insulating film buried in the second device isolation trench;
   forming in the first region of the semiconductor substrate a first well of the first conductivity type, deeper than a bottom of the second device isolation insulating film, and shallower than a bottom of the first device isolation insulating film;
   forming a gate insulating film above the first part;
   forming a gate electrode above the gate insulating film; and
   forming an interconnection electrically connected to the second part of the first well and the gate electrode.

8. The method of manufacturing a semiconductor device according to claim 7, wherein
   the impurity layer has an impurity concentration higher than an impurity concentration of the first well on the same depth level.

9. The method of manufacturing a semiconductor device according to claim 7, wherein
   forming the impurity layer includes:
      forming a second insulating film above the semiconductor substrate with the first device isolation trench and the second device isolation trench formed in;
      removing the second insulating film so as to expose a bottom of the second device isolation trench and leave the second insulating film on a bottom of the first device isolation trench; and
      making ion-implantation with the second insulating film as a mask to form the impurity layer selectively in the bottom of the second device isolation trench.

10. The method of manufacturing a semiconductor device according to claim 9, further comprising, after removing the second insulating film:
    forming a sidewall spacer on a side wall of the first device isolation trench and a side wall of the second device isolation trench; and
    forming a metal silicide layer selectively on the bottom of the second device isolation trench with the second insulating film and the sidewall spacer as a mask.

11. The method of manufacturing a semiconductor device according to claim 10, wherein
    the metal silicide layer is formed of tungsten silicide, titanium silicide or cobalt silicide.

12. The method of manufacturing a semiconductor device according to claim 7, wherein
    forming the first well is made earlier than forming the first device isolation trench and the second device isolation trench.

13. The method of manufacturing a semiconductor device according to claim 7, further comprising, after forming the gate electrode:
    forming a mask film covering the gate electrode and the second part;

forming a trench in the semiconductor substrate by etching the semiconductor substrate in the first part with the mask film as a mask;

forming in the trench a first epitaxial layer having an etching characteristic different from an etching characteristic of the semiconductor substrate, and a second epitaxial layer having an etching characteristic different from the etching characteristic of the first epitaxial layer;

removing the first device isolation insulating film with the mask film as a mask until at least a part of the first epitaxial layer is exposed;

selectively removing the first epitaxial layer; and burying a third insulating film in a part from which the first epitaxial layer is removed and a part from which the first device isolation insulating film is removed to form a buried insulating layer buried below the second epitaxial layer, while repairing the first device isolation insulating film.

14. The method of manufacturing a semiconductor device according to claim 7, further comprising:

forming in the first region of the semiconductor substrate a second well of a second conductivity type, deeper than the first well, and in contact with the first device isolation insulating film.

15. A method of manufacturing a semiconductor device comprising:

forming in a semiconductor substrate a first device isolation trench and a second device isolation trench shallower than the first device isolation trench, the first device isolation trench defining a first region, the second device isolation trench defining a first part and a second part in the first region;

forming a metal silicide layer selectively on a bottom of the second device isolation trench;

forming a first insulating film above the semiconductor substrate with the first device isolation trench and the second device isolation trench formed in;

planarizing the first insulating film to form a first device isolation insulating film buried in the first device isolation trench and a second device isolation insulating film buried in the second device isolation trench;

forming in the first region of the semiconductor substrate a first well of the first conductivity type, deeper than a bottom of the second device isolation insulating film, and shallower than a bottom of the first device isolation insulating film;

forming a gate insulating film above the first part;

forming a gate electrode above the gate insulating film; and forming an interconnection electrically connected to the second part of the first well and the gate electrode.

16. The method of manufacturing a semiconductor device according to claim 15, wherein the metal silicide layer is formed of tungsten silicide, titanium silicide or cobalt silicide.

* * * * *